(12) United States Patent
Choi et al.

(10) Patent No.: US 11,200,944 B2
(45) Date of Patent: *Dec. 14, 2021

(54) SEMICONDUCTOR MEMORY APPARATUS OPERATING IN A REFRESH MODE AND METHOD FOR PERFORMING THE SAME

(71) Applicant: SK hynix Inc., Icheon-si (KR)

(72) Inventors: Joon Woo Choi, Icheon-si (KR); Chang Ki Baek, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/984,662

(22) Filed: Aug. 4, 2020

(65) Prior Publication Data
US 2020/0381038 A1    Dec. 3, 2020

Related U.S. Application Data

(63) Continuation-in-part of application No. 16/103,671, filed on Aug. 14, 2018, now Pat. No. 10,741,240.

(30) Foreign Application Priority Data

Dec. 21, 2017  (KR) .......................... 10-2017-0176851

(51) Int. Cl.
*G11C 11/40*    (2006.01)
*G11C 11/408*   (2006.01)
*G11C 11/406*   (2006.01)

(52) U.S. Cl.
CPC ........ *G11C 11/4085* (2013.01); *G11C 11/406* (2013.01)

(58) Field of Classification Search
CPC ....................... G11C 11/4085; G11C 11/406
See application file for complete search history.

(56) References Cited

U.S. PATENT DOCUMENTS

| | | | |
|---|---|---|---|
| 4,879,685 A | 11/1989 | Takemae | |
| 5,719,819 A | 2/1998 | Maeno | |
| 6,633,500 B1* | 10/2003 | Chou | G11C 16/3418 365/185.25 |
| 7,187,604 B2* | 3/2007 | Takita | G11C 11/406 365/200 |
| 8,503,247 B2 | 8/2013 | Yoshioka | |
| 9,240,235 B2 | 1/2016 | Alrod et al. | |

FOREIGN PATENT DOCUMENTS

| | | |
|---|---|---|
| KR | 100248259 B1 | 3/2000 |
| KR | 1020150024140 A | 3/2015 |

* cited by examiner

*Primary Examiner* — Vanthu T Nguyen
(74) *Attorney, Agent, or Firm* — William Park & Associates Ltd.

(57) ABSTRACT

A semiconductor memory apparatus includes a plurality of memory cells. Each memory cell includes a switching element and a storage capacitor. The semiconductor memory apparatus further includes a first word line extended from a part of the plurality of memory cells, a second word line which is enabled after the first word line is enabled in a refresh mode for refreshing data stored in the storage capacitor, a word line control circuit configured to enable and disable the first word line. The word line control circuit comprises at least one switch that couples and decouples the first word line and the second word line.

17 Claims, 10 Drawing Sheets

FIG.2
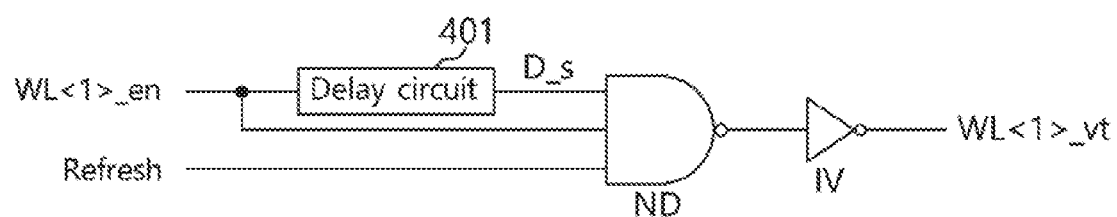
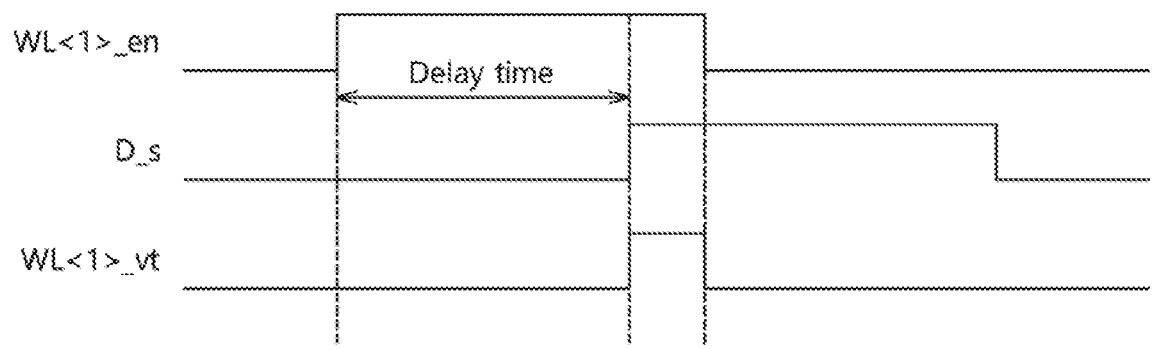

SEMICONDUCTOR MEMORY APPARATUS OPERATING IN A REFRESH MODE AND METHOD FOR PERFORMING THE SAME

CROSS-REFERENCES TO RELATED APPLICATION

The present application is a continuation-in-part application of U.S. application Ser. No. 16/103,671, filed on Aug. 14, 2018, which claims priority under 35 U.S.C. § 119(a) to Korean application number 10-2017-0176851, filed on Dec. 21, 2017, in the Korean Intellectual Property Office, which is incorporated herein by reference in its entirety.

BACKGROUND

1. Technical Field

Various embodiments generally relate to a semiconductor integrated circuit, and, more particularly, to a semiconductor memory apparatus.

2. Related Art

Semiconductor memory apparatuses are configured to receive and store data and to output stored data.

A semiconductor memory apparatus may store data by charging or discharging a capacitor and thereby performing a refresh operation.

A refresh operation, however, can consume and undesirably high amount of power.

SUMMARY

In accordance with an embodiment, a semiconductor memory apparatus may include a plurality of memory cells. Each memory cell includes a switching element and a storage capacitor. The semiconductor memory apparatus further includes a first word line extended from a part of the plurality of memory cells, a second word line which is enabled after the first word line is enabled in a refresh mode for refreshing data stored in the storage capacitor, and a word line control circuit configured to enable and disable a word line. The word line control circuit includes a switch which couples and decouples the word line to and from at least one other word line.

Also in accordance with an embodiment, a semiconductor memory apparatus may include a word line control circuit configured to enable and disable a word line, wherein the word line control circuit includes a switch that couples and decouples the word line and a capacitor.

Also in accordance with an embodiment, a DRAM device may include a first driver configured to enable or disable a first word line in response to a first word line enable signal. The semiconductor memory apparatus may additionally include a first switch configured to couple and decouple the first word line and a second word line in response to a first voltage transfer signal. The semiconductor memory apparatus may further include a first control signal generation circuit configured to generate the first voltage transfer signal in response to a refresh signal and the first word line enable signal. The second word line is enabled after the first word line is enabled when the refresh signal is enabled.

Also in accordance with an embodiment, a semiconductor memory apparatus may include a control signal generation circuit configured to generate a plurality of voltage transfer signals in response to a refresh signal for refreshing data stored in a storage capacitor and a word line enable signal. The semiconductor memory apparatus may additionally include a word line control circuit configured to enable or disable a word line, couple the word line to a capacitor in response to the plurality of voltage transfer signals, and decouple the word line from the capacitor in response to the plurality of voltage transfer signals.

BRIEF DESCRIPTION OF THE DRAWINGS

FIG. 2 shows a configuration diagram and a timing diagram of the first control signal generation circuit of FIG. 1.

DETAILED DESCRIPTION

Hereinafter, a semiconductor memory apparatus will be described below with reference to the accompanying drawings through various examples of embodiments. In accordance with some embodiments, a semiconductor memory apparatus is capable of reducing its power consumption when performing a refresh operation. By reducing the power consumption of a refresh operation, it is possible to realize a semiconductor memory apparatus having greater power efficiency.

Figure 1:
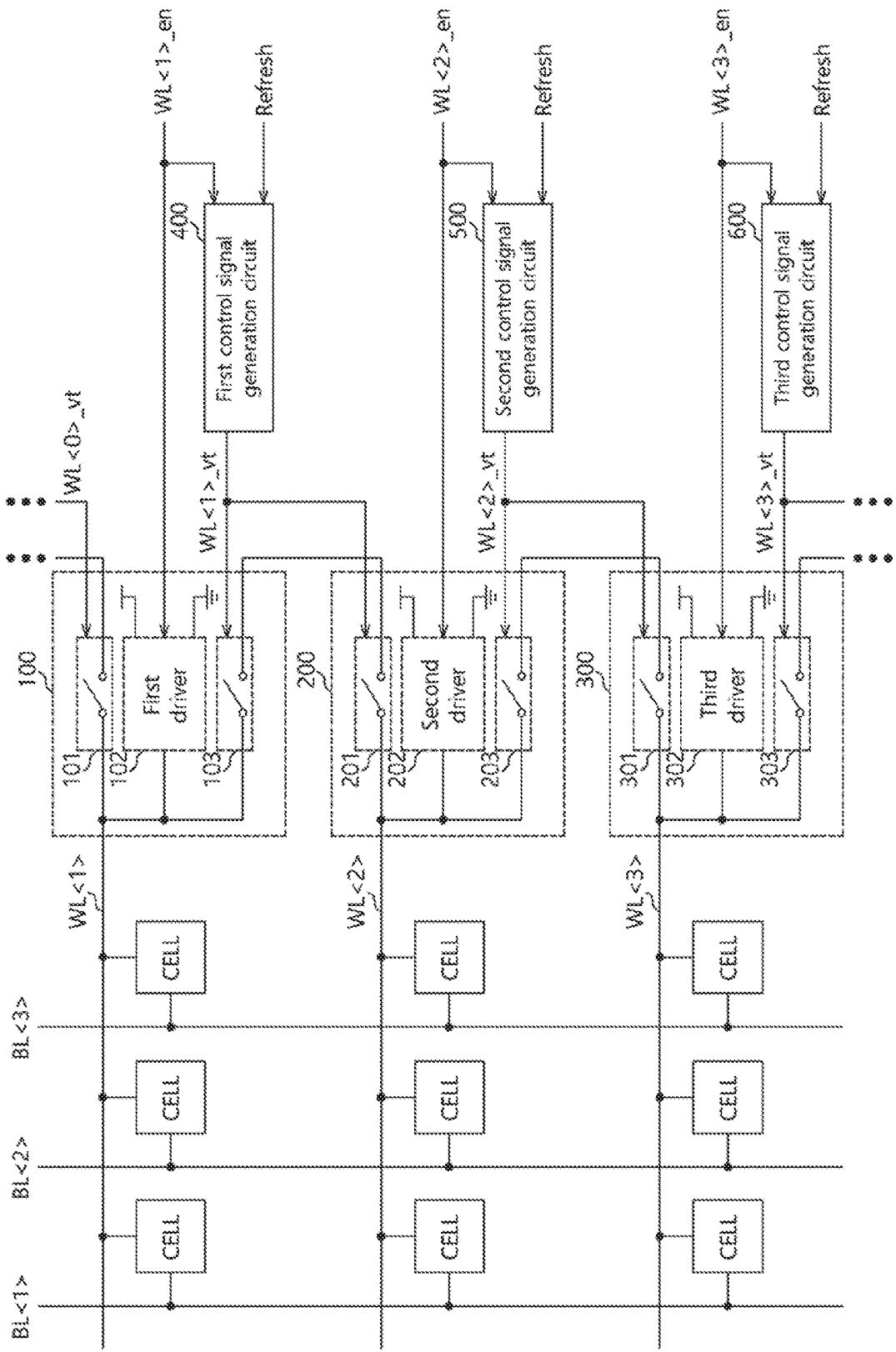
FIG. 1 shows a configuration diagram illustrating a semiconductor memory apparatus in accordance with an embodiment of the present teachings.

FIG. 1 shows a semiconductor memory apparatus 150 in accordance with an embodiment. The memory apparatus 150 includes a DRAM (dynamic random access memories) device. The semiconductor memory apparatus 150 may include first, second, and third word line control circuits 100, 200, and 300, respectively. The semiconductor memory apparatus 150 may also include first, second, and third control signal generation circuits 400, 500, and 600, respectively.

The semiconductor memory apparatus may additionally include a plurality of memory cells which are coupled to a plurality of bit lines and a plurality of word lines. For example, FIG. 1 shows first to third bit lines BL<1:3> and first to third word lines WL<1:3>. Memory cells CELL are disposed and coupled where the first to third bit lines BL<1:3> intersect with the first to third word lines WL<1:3>. For an embodiment, each memory cell CELL may be constructed by one transistor as a switching element and one capacitor as a storage element (hereinafter, a storage capacitor). When one of the first to third word lines WL<1:3> is selected and a voltage for storing data is applied to the one of the first to third bit lines BL<1:3>, a transistor which is connected to the selected word line and the bit line to which the voltage is applied, is activated, and the data is stored in a storage capacitor connected to the activated transistor.

For some embodiments, the semiconductor memory apparatus 150 includes the memory cells CELL as well as a set of word lines and a set of capacitors. As used herein a set includes at least one element. For example, a set of capacitors can include a single capacitor or include multiple capacitors.

The word "coupled," as used herein for some embodiments, means that two components are directly connected with one another. For example, a first component coupled to a second component means the first component is contacting the second component. For other embodiments, coupled components have one or more intervening components. For example, a first component is coupled to a second component when the first and second components are both in contact with a common third component even though the first component is not directly contacting the second component.

The first word line control circuit 100 may enable the first word line WL<1> by applying a driving voltage to the first word line WL<1> and may disable the first word line WL<1> by discharging the first word line WL<1>, depending on a first word line enable signal WL<1> _en. The first word line control circuit 100 may be electrically coupled with a previous word line control circuit (not shown) before the first word line WL<1> is enabled, in response to a zeroth voltage transfer signal WL<0>_vt. The first word line control circuit 100 may be electrically coupled with the second word line control circuit 200 before the first word line WL<1> is disabled, in response to a first voltage transfer signal WL<1>_vt.

The first word line control circuit 100 may include first and second switches 101 and 103 and a first driver 102.

The first switch 101 may electrically couple or decouple the first word line WL<1> and a previous word line control circuit (not shown) in response to the zeroth voltage transfer signal WL<0>_vt. For example, the first switch 101 electrically couples the first word line WL<1> and the previous word line control circuit when the zeroth voltage transfer signal WL<0>_vt is enabled. The first switch 101 electrically decouples the first word line WL<1> and the previous word line control circuit when the zeroth voltage transfer signal WL<0>_vt is disabled. The previous word line control circuit enables and disables a previous word line, which is also referred to herein as the zeroth word line.

The first driver 102 may enable or disable the first word line WL<1> in response to the first word line enable signal WL<1> _en. For example, the first driver 102 may enable the first word line WL<1> by applying a driving voltage to the first word line WL<1> when the first word line enable signal WL<1> _en is enabled. The first driver 102 may disable the first word line WL<1> by coupling the first word line WL<1> and a ground terminal when the first word line enable signal WL<1> _en is disabled.

The second switch 103 may electrically couple or decouple the first word line WL<1> and the second word line control circuit 200 in response to the first voltage transfer signal WL<1>_vt. For example, the second switch 103 electrically couples the first word line WL<1> and the second word line control circuit 200 when the first voltage transfer signal WL<1>_vt is enabled. The second switch 103 electrically decouples the first word line WL<1> and the second word line control circuit 200 when the first voltage transfer signal WL<1>_vt is disabled.

The second word line control circuit 200 may enable the second word line WL<2> by applying a driving voltage to the second word line WL<2> and may disable the second word line WL<2> by discharging the second word line WL<2>, depending on a second word line enable signal WL<2> _en. The second word line control circuit 200 may be electrically coupled with the first word line control circuit 100 before the second word line WL<2> is enabled, in response to the first voltage transfer signal WL<1>_vt. The second word line control circuit 200 may be electrically coupled with the third word line control circuit 300 before the second word line WL<2> is disabled, in response to a second voltage transfer signal WL<2>_vt.

The second word line control circuit 200 may include third and fourth switches 201 and 203 and a second driver 202.

The third switch 201 may electrically couple or decouple the second word line WL<2> and a previous word line control circuit (the first word line control circuit 100) in response to the first voltage transfer signal WL<1>_vt. For example, the third switch 201 electrically couples the second word line WL<2> and the second switch 103 of the first word line control circuit 100 when the first voltage transfer signal WL<1>_vt is enabled. The third switch 201 electrically decouples the second word line WL<2> and the second switch 103 of the first word line control circuit 100 when the first voltage transfer signal WL<1>_vt is disabled.

The second driver 202 may enable or disable the second word line WL<2> in response to the second word line enable signal WL<2> _en. For example, the second driver 202 may enable the second word line WL<2> by applying a driving voltage to the second word line WL<2> when the second word line enable signal WL<2> _en is enabled. The second driver 202 may disable the second word line WL<2> by coupling the second word line WL<2> and a ground terminal when the second word line enable signal WL<2> _en is disabled.

The fourth switch 203 may electrically couple or decouple the second word line WL<2> and the third word line control circuit 300 in response to the second voltage transfer signal WL<2>_vt. For example, the fourth switch 203 electrically couples the second word line WL<2> and the third word line control circuit 300 when the second voltage transfer signal WL<2>_vt is enabled. The fourth switch 203 electrically decouples the second word line WL<2> and the third word line control circuit 300 when the second voltage transfer signal WL<2>_vt is disabled.

The third word line control circuit 300 may enable the third word line WL<3> by applying a driving voltage to the third word line WL<3> and may disable the third word line WL<3> by discharging the third word line WL<3>, depending on a third word line enable signal WL<3> _en. The third word line control circuit 300 may be electrically coupled with the second word line control circuit 200 before the third word line WL<3> is enabled, in response to the second voltage transfer signal WL<2>_vt. The third word line control circuit 300 may be electrically coupled with a next word line control circuit (not shown) before the third word line WL<3> is disabled, in response to a third voltage transfer signal WL<3>_vt. For some embodiments, the third word line control circuit 300 is associated with the third word line WL_<3>, the second word line control circuit 200 is associated with the second word line WL_<2>, the first word line control circuit 100 is associated with the first word line WL_<1>, and the previous word line control circuit is associated with the zeroth word line (not shown).

The third word line control circuit 300 may include fifth and sixth switches 301 and 303 and a third driver 302.

The fifth switch 301 may electrically couple or decouple the third word line WL<3> and a previous word line control circuit (the second word line control circuit 200) in response to the second voltage transfer signal WL<2>_vt. For example, the fifth switch 301 electrically couples the third word line WL<3> and the fourth switch 203 of the second word line control circuit 200 when the second voltage transfer signal WL<2>_vt is enabled. The fifth switch 301 electrically decouples the third word line WL<3> and the fourth switch 203 of the second word line control circuit 200 when the second voltage transfer signal WL<2>_vt is disabled.

The third driver 302 may enable or disable the third word line WL<3> in response to the third word line enable signal WL<3> _en. For example, the third driver 302 may enable the third word line WL<3> by applying a driving voltage to the third word line WL<3> when the third word line enable signal WL<3> _en is enabled. The third driver 302 may disable the third word line WL<3> by coupling the third word line WL<3> and a ground terminal when the third word line enable signal WL<3> _en is disabled.

The sixth switch 303 may electrically couple or decouple the third word line WL<3> and the next word line control circuit in response to the third voltage transfer signal WL<3>_vt. For example, the sixth switch 303 electrically couples the third word line WL<3> and the next word line control circuit when the third voltage transfer signal WL<3>_vt is enabled. The sixth switch 303 electrically decouples the third word line WL<3> and the next word line control circuit when the third voltage transfer signal WL<3>_vt is disabled.

The first control signal generation circuit 400 may generate the first voltage transfer signal WL<1>_vt in response to the first word line enable signal WL<1> _en and a refresh signal Refresh. As well known, DRAM device requires periodic refreshing of the memory cells so that the data stored within the storage capacitor of each memory cell does not corrupt or decay over time. By periodically refreshing each row of memory cells of the DRAM device, energy is supplied to each of the storage capacitors of the memory cells so that the data stored in the storage capacitors do not decay. For example, the refresh signal may be enabled in response to a periodically generated a refresh command.

For example, the first control signal generation circuit 400 disables the first voltage transfer signal WL<1>_vt regardless of the first word line enable signal WL<1> _en when the refresh signal Refresh is disabled. When the refresh signal Refresh is enabled, the first control signal generation circuit 400 enables the first voltage transfer signal WL<1>_vt before the first word line enable signal WL<1> _en is disabled, and disables the first voltage transfer signal WL<1>_vt when the first word line enable signal WL<1> _en is disabled.

The second control signal generation circuit 500 may generate the second voltage transfer signal WL<2>_vt in response to the second word line enable signal WL<2> _en and the refresh signal Refresh. For example, the second control signal generation circuit 500 disables the second voltage transfer signal WL<2>_vt regardless of the second word line enable signal WL<2> _en when the refresh signal Refresh is disabled. When the refresh signal Refresh is enabled, the second control signal generation circuit 500 enables the second voltage transfer signal WL<2>_vt before the second word line enable signal WL<2> _en is disabled, and disables the second voltage transfer signal WL<2>_vt when the second word line enable signal WL<2> _en is disabled.

The third control signal generation circuit 600 may generate the third voltage transfer signal WL<3>_vt in response to the third word line enable signal WL<3> _en and the refresh signal Refresh. For example, the third control signal generation circuit 600 disables the third voltage transfer signal WL<3>_vt regardless of the third word line enable signal WL<3> _en when the refresh signal Refresh is disabled. When the refresh signal Refresh is enabled, the third control signal generation circuit 600 enables the third voltage transfer signal WL<3>_vt before the third word line enable signal WL<3> _en is disabled, and disables the third voltage transfer signal WL<3>_vt when the third word line enable signal WL<3> _en is disabled.

The respective first to third control signal generation circuits 400, 500, and 600 disable the first to third voltage transfer signals WL<1>_vt, WL<2>_vt, and WL<3>_vt when the refresh signal Refresh is disabled. When the refresh signal Refresh is enabled, the respective first to third control signal generation circuits 400, 500, and 600 enable the voltage transfer signals WL<1>_vt, WL<2>_vt and WL<3>_vt in the enable periods of the word line enable signals WL<1> _en, WL<2> _en, and WL<3> _en, and disable the voltage transfer signals WL<1>_vt, WL<2>_vt, and WL<3>_vt when the word line enable signals WL<1> _en, WL<2> _en, and WL<3> _en are disabled.

In an embodiment, the first to third control signal generation circuits 400, 500, and 600 may have the same configuration except that signals inputted thereto and outputted therefrom are different. Therefore, the configuration of the first control signal generation circuit 400 is described, and descriptions for the configurations of the remaining control signal generation circuits 500 and 600 are omitted.

FIG. 2 shows the first control signal generation circuit 400 of the semiconductor memory device 150 of FIG. 1. The first control signal generation circuit 400 may include a delay circuit 401, a NAND gate ND, and an inverter IV. The delay circuit 401 receives the first word line enable signal WL<1> _en and outputs a delayed signal D_s. The NAND gate ND receives the delayed signal D_s, the first word line enable signal WL<1> _en, and the refresh signal Refresh. The inverter IV receives and inverts an output signal of the NAND gate ND and outputs the first voltage transfer signal WL<1>_vt.

The operation of the first control signal generation circuit 400 configured as indicated above is described below with reference to FIG. 2.

When the refresh signal Refresh is enabled, the first word line enable signal WL<1> _en is delayed through the delay circuit 401 and is outputted as the delayed signal D_s. Through the NAND gate ND and the inverter IV, a period in which the enable periods (high level periods) of the first word line enable signal WL<1> _en and the delayed signal D_s overlap with each other is outputted as the enable period of the first voltage transfer signal WL<1>_vt. The first voltage transfer signal WL<1>_vt is enabled at a time earlier than the disable time of the first word line enable signal WL<1> _en, and is disabled when the first word line enable signal WL<1> _en is disabled.

As indicated above, the second and third control signal generation circuits 500 and 600 may be configured in the same manner as the first control signal generation circuit 400. Thus, in the case where the refresh signal Refresh is enabled, the timing diagram of the first to third control signal generation circuits 400, 500, and 600 may be illustrated as in FIG. 3.

Figure 3:
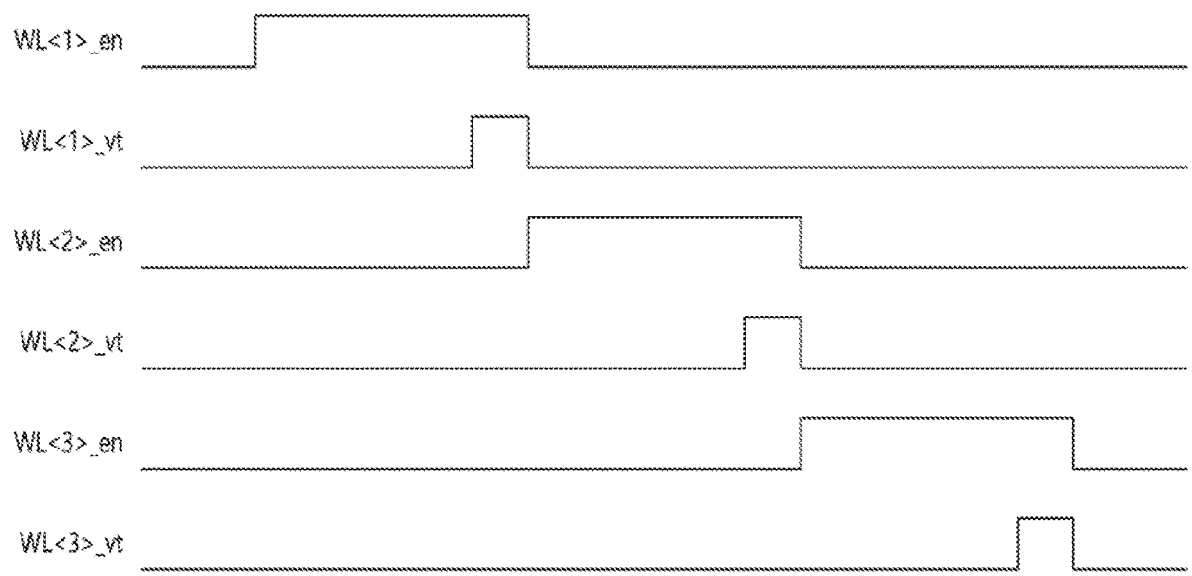
FIG. 3 shows a timing diagram for the semiconductor memory apparatus of FIG. 1.

In a refresh operation, that is, when the refresh signal Refresh is enabled, the first to third word line enable signals WL<1> _en, WL<2> _en, and WL<3> _en are sequentially enabled, as shown in FIG. 3. For example, if the first word line enable signal WL<1> _en is disabled, then the second word line enable signal WL<2> _en is enabled. If the second word line enable signal WL<2> _en is disabled, then the third word line enable signal WL<3> _en is enabled. The first voltage transfer signal WL<1>_vt is enabled before the first word line enable signal WL<1> _en is disabled, and is disabled when the first word line enable signal WL<1> _en is disabled. The second voltage transfer signal WL<2>_vt is enabled before the second word line enable signal WL<2> _en is disabled, and is disabled when the second word line enable signal WL<2> _en is disabled. The third voltage transfer signal WL<3>_vt is enabled before the third word line enable signal WL<3> _en is disabled, and is disabled when the third word line enable signal WL<3> _en is disabled.

The operation of the semiconductor memory apparatus 150 in accordance with an embodiment is described below with reference to FIGS. 1 and 3.

An operation which is not a refresh operation, that is, where the refresh signal Refresh is disabled, is described first.

If the refresh signal Refresh is disabled, then the first to third control signal generation circuits 400, 500, and 600 disable the first to third voltage transfer signals WL<1>_vt, WL<2>_vt, and WL<3>_vt regardless of the first to third word line enable signals WL<1> _en, WL<2> _en, and WL<3> _en.

The second to sixth switches 103, 201, 203, 301, and 303 responding to the first to third voltage transfer signals WL<1>_vt, WL<2>_vt, and WL<3>_vt are all turned off (open). That is to say, the second and third switches 103 and 201 electrically decouple the first word line control circuit 100 and the second word line control circuit 200. The fourth and fifth switches 203 and 301 electrically decouple the second word line control circuit 200 and the third word line control circuit 300.

If the refresh signal Refresh is disabled, then the first to third word line control circuits 100, 200, and 300 shown in FIG. 1 are electrically decoupled from one another.

In other words, the semiconductor memory apparatus 150 operates such that, when it is not a refresh operation, all word line control circuits are electrically decoupled and only the drivers included in the word line control circuits enable or disable word lines.

A refresh operation, that is, the case where the refresh signal Refresh is enabled, is next described.

If the refresh signal Refresh is enabled, then the first to third control signal generation circuits 400, 500, and 600 generate the first to third voltage transfer signals WL<1>_vt, WL<2>_vt, and WL<3>_vt in response to the first to third word line enable signals WL<1> _en, WL<2> _en, and WL<3> _en, respectively. As shown in FIG. 3, the respective first to third voltage transfer signals WL<1>_vt, WL<2>_vt, and WL<3>_vt are enabled before the respective first to third word line enable signals WL<1> _en, WL<2> _en, and WL<3> _en are disabled. Also, the respective first to third voltage transfer signals WL<1>_vt, WL<2>_vt, and WL<3>_vt are disabled when the respective first to third word line enable signals WL<1> _en, WL<2> _en, and WL<3> _en are disabled.

The operation of the semiconductor memory apparatus 150 is described below with reference to FIG. 1.

In a refresh operation, as shown in FIG. 3, the first to third word line enable signals WL<1> _en, WL<2> _en, and WL<3> _en are sequentially enabled.

If the first word line enable signal WL<1> _en is enabled, then the first driver 102 enables the first word line WL<1> by applying a driving voltage to the first word line WL<1>. The first voltage transfer signal WL<1>_vt is enabled before the first word line enable signal WL<1> _en is disabled.

If the first voltage transfer signal WL<1>_vt is enabled, then the second and third switches 103 and 201 are turned on, and the first word line WL<1> and the second word line WL<2> are electrically coupled. The charges of the first word line WL<1>, which is enabled to the level of the driving voltage, are transferred to the second word line WL<2>.

If the first word line enable signal WL<1> _en is disabled, then the first voltage transfer signal WL<1>_vt is disabled, and the first and second word lines WL<1> and WL<2> are electrically decoupled. If the first word line enable signal WL<1> _en is disabled, then the first word line WL<1> is discharged and disabled.

When the first word line enable signal WL<1> _en is disabled, then the second word line enable signal WL<2> _en is enabled.

If the second word line enable signal WL<2> _en is enabled, then the second driver 202 enables the second word line WL<2> by applying a driving voltage to the second word line WL<2>. At this time, the second word line WL<2> is in a state in which charges enabling the first word line WL<1> are transferred to the second word line WL<2> before the first word line WL<1> is discharged, that is, disabled. Therefore, current or power to be used for the second driver 202 to enable the second word line WL<2> is reduced.

The second voltage transfer signal WL<2>_vt is enabled before the second word line enable signal WL<2> _en is disabled.

Namely, by the second voltage transfer signal WL<2>_vt, which is enabled before the second word line WL<2> is discharged, the fourth and fifth switches 203 and 301 are turned on, and the second and third word lines WL<2> and WL<3> are electrically coupled. As the second and third word lines WL<2> and WL<3> are electrically coupled before the second word line WL<2> is discharged, charges enabling the second word line WL<2> are transferred to the third word line WL<3>.

If the second word line WL<2> is disabled, then the second voltage transfer signal WL<2>_vt is disabled. If the second voltage transfer signal WL<2>_vt is disabled, then the fourth and fifth switches 203 and 301 are turned off, and the second and third word lines WL<2> and WL<3> are electrically decoupled. Also, the second word line WL<2> is discharged and disabled.

When the second word line enable signal WL<2> _en is disabled, then the third word line enable signal WL<3> _en is enabled.

If the third word line enable signal WL<3> _en is enabled, then the third driver 302 enables the third word line WL<3> by applying a driving voltage to the third word line WL<3>. At this time, the third word line WL<3> is in a state in which charges enabling the second word line WL<2> are transferred to the third word line WL<3> before the second word line WL<2> is discharged, that is, disabled. Therefore, current or power to be used for the third driver 302 to enable the third word line WL<3> is reduced.

In this way, during a refresh operation, charges having enabled a previous word line are transferred to a next word line before the previous word line is disabled. Thus, current or power that would otherwise be consumed to enable the next word line may be reduced.

Figure 4:
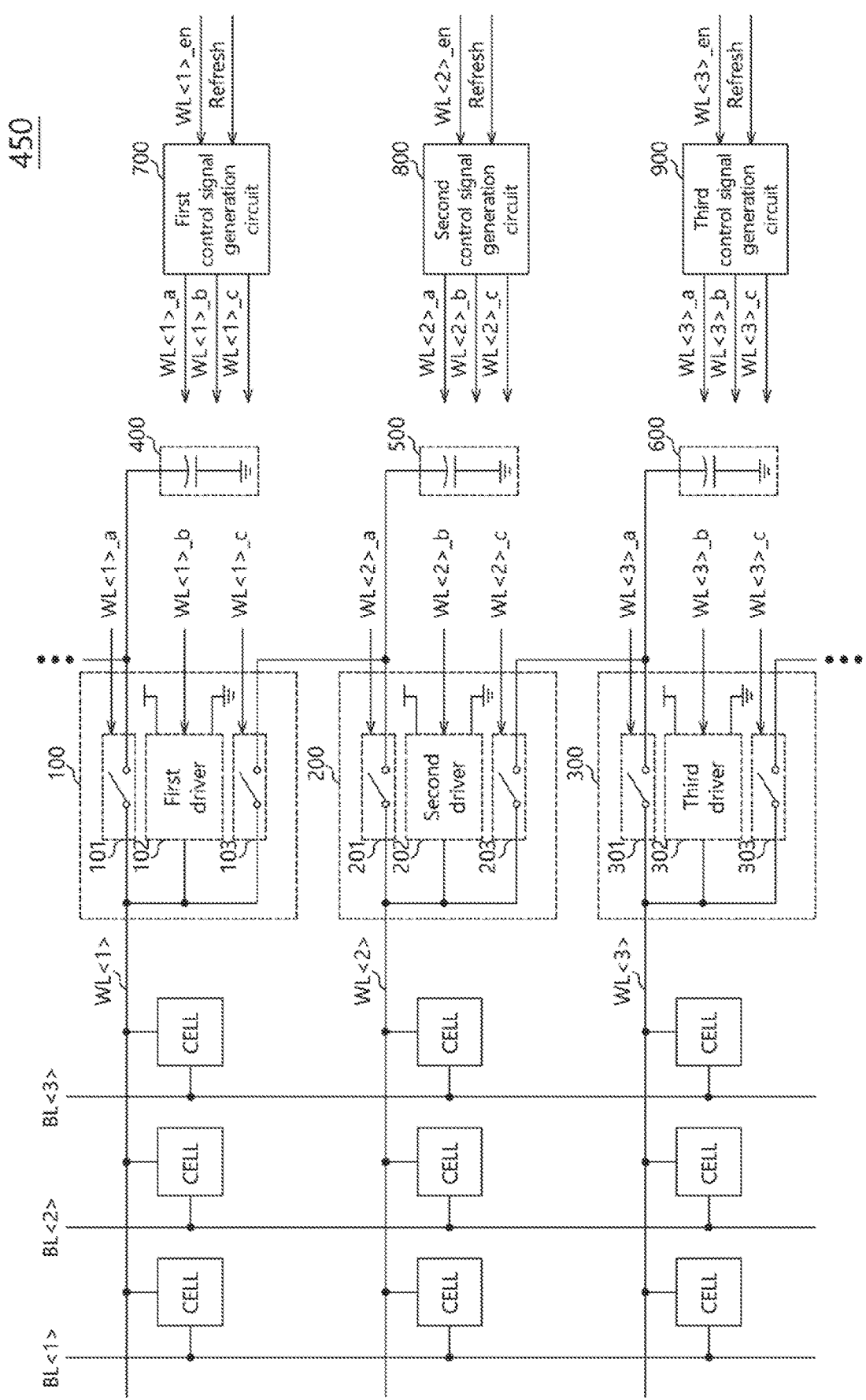
FIG. 4 shows a configuration diagram illustrating a semiconductor memory apparatus in accordance with an embodiment of the present teachings.

As shown in FIG. 4, a semiconductor memory apparatus 450 in accordance with another embodiment may include first to third word line control circuits 100, 200, and 300; first to third capacitors 400, 500, and 600; and first to third control signal generation circuits 700, 800, and 900.

The semiconductor memory apparatus 450 may include a plurality of memory cells which are coupled to a plurality of bit lines and a plurality of word lines. For example, as shown in FIG. 4, memory cells CELL are disposed and coupled where first to third bit lines BL<1:3> intersect with first to third word lines WL<1:3>. For an embodiment, each memory cell CELL may include one transistor and one capacitor.

The first word line control circuit 100 may electrically couple or decouple the first capacitor 400 and the first word line WL<1> before the first word line WL<1> is enabled, in response to a first voltage transfer signal WL<1>_a. The first word line control circuit 100 may enable the first word line WL<1> by applying a driving voltage to the first word line WL<1> and may disable the first word line WL<1> by discharging the first word line WL<1>, depending on a second voltage transfer signal WL<1>_b. The first word line control circuit 100 may electrically couple the second capacitor 500 and the first word line WL<1> before the first word line WL<1> is disabled, in response to a third voltage transfer signal WL<1>_c.

The first capacitor 400 may be coupled between the first word line control circuit 100 and a previous word line control circuit (not shown). The first capacitor 400 has one end to which a line coupled with the first word line control circuit 100 and the previous word line control circuit is coupled and the other end to which a ground terminal is coupled.

The first word line control circuit 100 may include first and second switches 101 and 103 and a first driver 102.

The first switch 101 may electrically couple or decouple the first word line WL<1> and the previous word line control circuit in response to the first voltage transfer signal WL<1>_a. Also, the first switch 101 may electrically couple or decouple the first word line WL<1> and the first capacitor 400 in response to the first voltage transfer signal WL<1>_a. For example, the first switch 101 electrically couples the first word line WL<1> and the first capacitor 400 when the first voltage transfer signal WL<1>_a is enabled. The first switch 101 electrically decouples the first word line WL<1> and the first capacitor 400 when the first voltage transfer signal WL<1>_a is disabled.

The first driver 102 may enable or disable the first word line WL<1> in response to the second voltage transfer signal WL<1>_b. For example, the first driver 102 may enable the first word line WL<1> by applying a driving voltage to the first word line WL<1> when the second voltage transfer signal WL<1>_b is enabled. The first driver 102 may disable the first word line WL<1> by coupling the first word line WL<1> and a ground terminal when the second voltage transfer signal WL<1>_b is disabled.

The second switch 103 may electrically couple or decouple the first word line WL<1> and the second capacitor 500 in response to the third voltage transfer signal WL<1>_c. For example, the second switch 103 electrically couples the first word line WL<1> and the second capacitor 500 when the third voltage transfer signal WL<1>_c is enabled. The second switch 103 electrically decouples the first word line WL<1> and the second capacitor 500 when the third voltage transfer signal WL<1>_c is disabled.

The second word line control circuit 200 may electrically couple or decouple the second capacitor 500 and the second word line WL<2> before the second word line WL<2> is enabled, in response to a fourth voltage transfer signal WL<2>_a. The second word line control circuit 200 may enable the second word line WL<2> by applying a driving voltage to the second word line WL<2> and may disable the second word line WL<2> by discharging the second word line WL<2>, depending on a fifth voltage transfer signal WL<2>_b. The second word line control circuit 200 may electrically couple the third capacitor 600 and the second word line WL<2> before the second word line WL<2> is disabled, in response to a sixth voltage transfer signal WL<2>_c.

The second capacitor 500 may be coupled between the second word line control circuit 200 and a previous word line control circuit (the first word line control circuit 100). The second capacitor 500 has one end to which a line coupled with the first word line control circuit 100 and the second word line control circuit 200 is coupled and the other end to which a ground terminal is coupled.

The second word line control circuit 200 may include third and fourth switches 201 and 203 and a second driver 202. The third switch 201 may electrically couple or decouple the second capacitor 500 with or from the second word line WL<2> in response to the fourth voltage transfer signal WL<2>_a. For example, the third switch 201 electrically couples the second word line WL<2> and the second capacitor 500 when the fourth voltage transfer signal WL<2>_a is enabled. The third switch 201 electrically decouples the second word line WL<2> and the second capacitor 500 when the fourth voltage transfer signal WL<2>_a is disabled.

The second driver 202 may enable or disable the second word line WL<2> in response to the fifth voltage transfer signal WL<2>_b. For example, the second driver 202 may enable the second word line WL<2> by applying a driving voltage to the second word line WL<2> when the fifth voltage transfer signal WL<2>_b is enabled. The second driver 202 may disable the second word line WL<2> by coupling the second word line WL<2> and a ground terminal when the fifth voltage transfer signal WL<2>_b is disabled.

The fourth switch 203 may electrically couple or decouple the second word line WL<2> and the third capacitor 600 in response to the sixth voltage transfer signal WL<2>_c. For example, the fourth switch 203 electrically couples the second word line WL<2> and the third capacitor 600 when the sixth voltage transfer signal WL<2>_c is enabled. The fourth switch 203 electrically decouples the second word line WL<2> and the third capacitor 600 when the sixth voltage transfer signal WL<2>_c is disabled.

The third word line control circuit 300 may electrically couple or decouple the third capacitor 600 and the third word line WL<3> before the third word line WL<3> is enabled, in response to a seventh voltage transfer signal WL<3>_a. The third word line control circuit 300 may enable the third word line WL<3> by applying a driving voltage to the third word line WL<3> and may disable the third word line WL<3> by discharging the third word line WL<3>, depending on an eighth voltage transfer signal WL<3>_b. The third word line control circuit 300 may electrically couple a next capacitor (not shown) and the third word line WL<3> before the third word line WL<3> is disabled, in response to a ninth voltage transfer signal WL<3>_c.

The third capacitor 600 may be coupled between the third word line control circuit 300 and a previous word line control circuit (the second word line control circuit 200). The third capacitor 600 has one end to which a line coupled with the second word line control circuit 200 and the third word line control circuit 300 is coupled and the other end to which a ground terminal is coupled.

The third word line control circuit 300 may include fifth and sixth switches 301 and 303 and a third driver 302. The fifth switch 301 may electrically couple or decouple the third capacitor 600 with or from the third word line WL<3> in response to the seventh voltage transfer signal WL<3>_a. For example, the fifth switch 301 electrically couples the third word line WL<3> and the third capacitor 600 when the seventh voltage transfer signal WL<3>_a is enabled. The fifth switch 301 electrically decouples the third word line WL<3> and the third capacitor 600 when the seventh voltage transfer signal WL<3>_a is disabled.

The third driver 302 may enable or disable the third word line WL<3> in response to the eighth voltage transfer signal WL<3>_b. For example, the third driver 302 may enable the third word line WL<3> by applying a driving voltage to the third word line WL<3> when the eighth voltage transfer signal WL<3>_b is enabled. The third driver 302 may disable the third word line WL<3> by coupling the third word line WL<3> and a ground terminal when the eighth voltage transfer signal WL<3>_b is disabled.

The sixth switch 303 may electrically couple or decouple the third word line WL<3> and the next capacitor in response to the ninth voltage transfer signal WL<3>_c. For example, the sixth switch 303 electrically couples the third word line WL<3> and the next capacitor when the ninth voltage transfer signal WL<3>_c is enabled. The sixth switch 303 electrically decouples the third word line WL<3> and the next capacitor when the ninth voltage transfer signal WL<3>_c is disabled.

The first control signal generation circuit 700 may generate the first to third voltage transfer signals WL<1>_a, WL<1>_b, and WL<1>_c in response to a first word line enable signal WL<1> _en and a refresh signal Refresh. For example, when the refresh signal Refresh is disabled, the first control signal generation circuit 700 disables the first and third voltage transfer signals WL<1>_a and WL<1>_c, regardless of the first word line enable signal WL<1> _en, and outputs the first word line enable signal WL<1> _en as the second voltage transfer signal WL<1>_b. When the refresh signal Refresh and the first word line enable signal WL<1> _en are enabled, the first control signal generation circuit 700 enables the first voltage transfer signal WL<1>_a for a predetermined time, enables the second voltage transfer signal WL<1>_b when the first voltage transfer signal WL<1>_a is disabled, and enables the third voltage transfer signal WL<1>_c before the first word line enable signal WL<1> _en is disabled. In the case where the refresh signal Refresh is enabled, if the first word line enable signal WL<1> _en is disabled, the first control signal generation circuit 700 disables the second and third voltage transfer signals WL<1>_b and WL<1>_c.

The word "predetermined" as used herein with respect to a parameter, such as a predetermined time period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The second control signal generation circuit 800 may generate the fourth to sixth voltage transfer signals WL<2>_a, WL<2>_b and WL<2>_c in response to a second word line enable signal WL<2> _en and the refresh signal Refresh. For example, when the refresh signal Refresh is disabled, the second control signal generation circuit 800 disables the fourth and sixth voltage transfer signals WL<2>_a and WL<2>_c, regardless of the second word line enable signal WL<2> _en, and outputs the second word line enable signal WL<2> _en as the fifth voltage transfer signal WL<2>_b. If the refresh signal Refresh is enabled, then the second control signal generation circuit 800 generates the fourth to sixth voltage transfer signals WL<2>_a, WL<2>_b, and WL<2>_c in response to the second word line enable signal WL<2> _en. For example, when the second word line enable signal WL<2> _en is enabled, the second control signal generation circuit 800 enables the fourth voltage transfer signal WL<2>_a, enables the fifth voltage transfer signal WL<2>_b when the fourth voltage transfer signal WL<2>_a is disabled, and enables the sixth voltage transfer signal WL<2>_c before the second word line enable signal WL<2> _en is disabled. In the case where the refresh signal Refresh is enabled, if the second word line enable signal WL<2> _en is disabled, the second control signal generation circuit 800 disables the fifth and sixth voltage transfer signals WL<2>_b and WL<2>_c.

The third control signal generation circuit 900 may generate the seventh to ninth voltage transfer signals WL<3>_a, WL<3>_b, and WL<3>_c in response to a third word line enable signal WL<3> _en and the refresh signal Refresh. For example, when the refresh signal Refresh is disabled, the third control signal generation circuit 900 disables the seventh and ninth voltage transfer signals WL<3>_a and WL<3>_c, regardless of the third word line enable signal WL<3> _en, and outputs the third word line enable signal WL<3> _en as the eighth voltage transfer signal WL<3>_b. If the refresh signal Refresh is enabled, then the third control signal generation circuit 900 generates the seventh to ninth voltage transfer signals WL<3>_a, WL<3>_b and WL<3>_c in response to the third word line enable signal WL<3> _en. For example, when the third word line enable signal WL<3> _en is enabled, the third control signal generation circuit 900 enables the seventh voltage transfer signal WL<3>_a, enables the eighth voltage transfer signal WL<3>_b when the seventh voltage transfer signal WL<3>_a is disabled, and enables the ninth voltage transfer signal WL<3>_c before the third word line enable signal WL<3> _en is disabled. In the case where the refresh signal Refresh is enabled, if the third word line enable signal WL<3> _en is disabled, the third control signal generation circuit 900 disables the eighth and ninth voltage transfer signals WL<3>_b and WL<3>_c.

If the refresh signal Refresh is disabled, then the respective first to third control signal generation circuits 700, 800, and 900 disable the first and third voltage transfer signals WL<1>_a and WL<1>_c, the fourth and sixth voltage transfer signals WL<2>_a and WL<2>_c, and the seventh and ninth voltage transfer signals WL<3>_a and WL<3>_c, and output the first to third word line enable signals WL<1> _en, WL<2> _en, and WL<3> _en as the second voltage transfer signal WL<1>_b, the fifth voltage transfer signal WL<2>_b, and the eighth voltage transfer signal WL<3>_b, respectively. If the refresh signal Refresh is enabled, then the respective first to third control signal generation circuits 700, 800, and 900 generate the voltage transfer signals WL<1>_a, WL<1>_b, WL<1>_c, WL<2>_a, WL<2>_b, WL<2>_c, WL<3>_a, WL<3>_b, and WL<3>_c, which are sequentially enabled in the enable periods of the word line enable signals WL<1> _en, WL<2> _en, and WL<3> _en.

For an embodiment, the first to third control signal generation circuits 700, 800, and 900 have the same configuration except that signals inputted thereto and outputted therefrom are different. Therefore, a configuration of the first control signal generation circuit 700 is described, and descriptions for the configurations of the remaining control signal generation circuits 800 and 900 are omitted.

Figure 5:
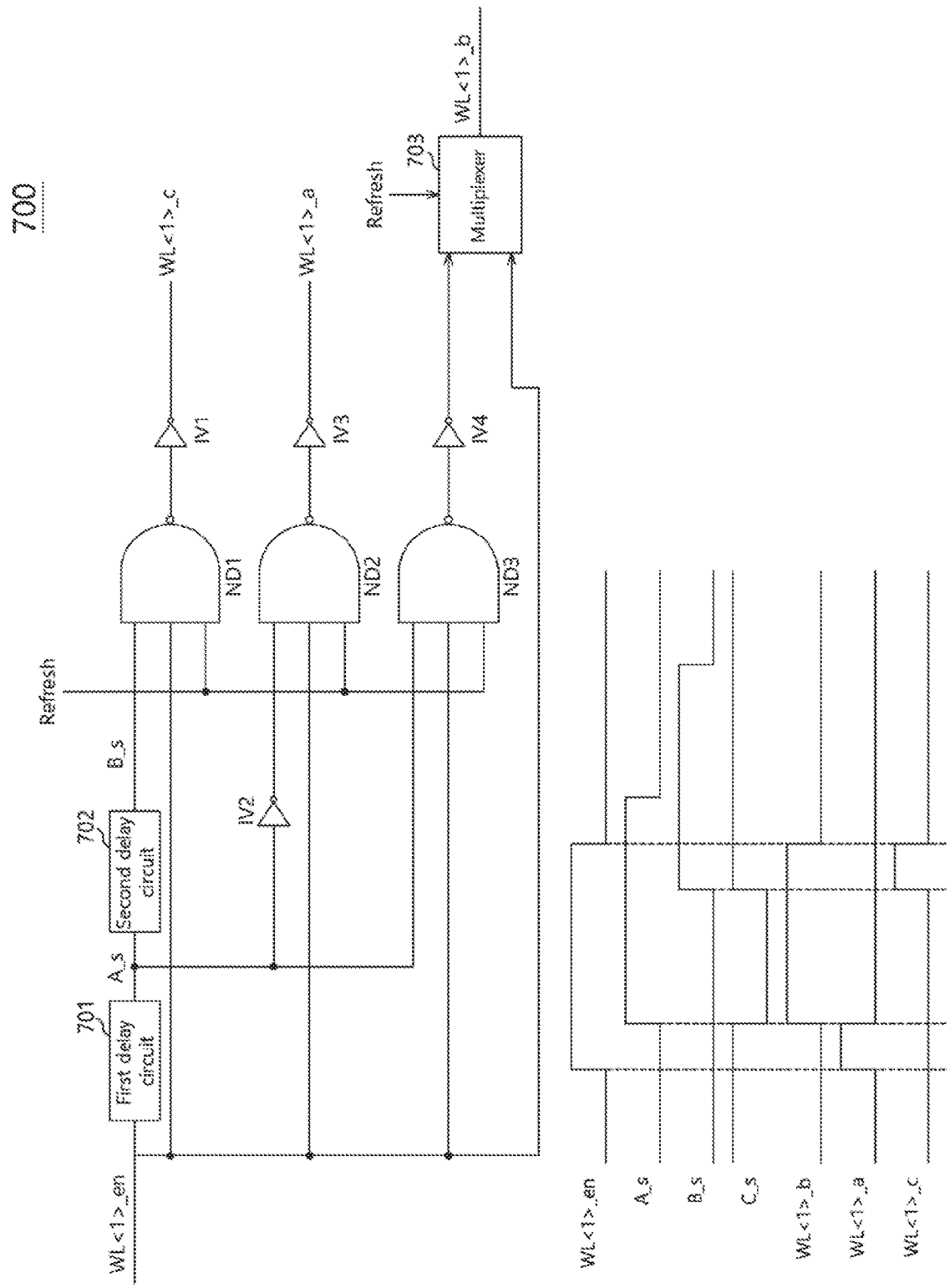
FIG. 5 shows a configuration diagram and a timing diagram for the first control signal generation circuit of FIG. 4.

As shown in FIG. 5, the first control signal generation circuit 700 may include first and second delay circuits 701 and 702; first to third NAND gates ND1, ND2, and ND3; first to fourth inverters IV1, IV2, IV3, and IV4; and a multiplexer 703. The first delay circuit 701 delays the first word line enable signal WL<1>_en and outputs a first signal A_s. The second delay circuit 702 delays the first signal A_s and outputs a second signal B_s. The first NAND gate ND1 receives the first word line enable signal WL<1> _en, the second signal B_s, and the refresh signal Refresh. The first inverter IV1 receives the output signal of the first NAND gate ND1 and outputs the third voltage transfer signal WL<1>_c. The second inverter IV2 receives the first signal A_s. The second NAND gate ND2 receives the first word line enable signal WL<1> _en, the output signal of the second inverter IV2, and the refresh signal Refresh. The third inverter IV3 receives the output signal of the second NAND gate ND2 and outputs the first voltage transfer signal WL<1>_a. The third NAND gate ND3 receives the first signal A_s, the first word line enable signal WL<1> _en, and the refresh signal Refresh. The fourth inverter IV4 receives the output signal of the third NAND gate ND3. The multiplexer 703 outputs one of the output signal of the fourth inverter IV4 and the first word line enable signal WL<1>_en as the second voltage transfer signal WL<1>_b, in response to the refresh signal Refresh. For example, the multiplexer 703 outputs the first word line enable signal WL<1> _en as the second voltage transfer signal WL<1>_b if the refresh signal Refresh is disabled. The multiplexer 703 outputs the output signal of the fourth inverter IV4 as the second voltage transfer signal WL<1>_b if the refresh signal Refresh is enabled.

The operation of the first control signal generation circuit 700 configured as indicated above, in the case where the refresh signal Refresh is disabled, is described below.

In the case where the refresh signal Refresh is disabled, the multiplexer 703 outputs the first word line enable signal WL<1> _en as the second voltage transfer signal WL<1>_b. In the case where the refresh signal Refresh is disabled, the first and third voltage transfer signals WL<1>_a and WL<1>_c are disabled regardless of the first word line enable signal WL<1> _en.

The operation of the first control signal generation circuit 700 in the case where the refresh signal Refresh is enabled is described below with reference to the timing diagram of FIG. 5.

The first delay circuit 701 delays the first word line enable signal WL<1> _en and outputs the first signal A_s. The second delay circuit 702 delays the first signal A_s and outputs the second signal B_s. With the refresh signal Refresh enabled, the combination of the first NAND gate ND1 and the first inverter IV1 outputs the third voltage transfer signal WL<1>_c of a high level in only a period in which both the second signal B_s and the first word line enable signal WL<1> _en are at high levels. With the refresh signal Refresh enabled, the combination of the second NAND gate ND2 and the third inverter IV3 outputs the first voltage transfer signal WL<1>_a of a high level in only a period in which the first signal A_s is at a low level and the first word line enable signal WL<1> _en is at the high level. With the refresh signal Refresh enabled, the combination of the third NAND gate ND3 and the fourth inverter IV4 outputs the second voltage transfer signal WL<1>_b as a high level signal through the multiplexer 703 in a period in which both the first signal A_s and the first word line enable signal WL<1> _en are at high levels.

Therefore, if the refresh signal Refresh is enabled, then the first control signal generation circuit 700 generates the first to third voltage transfer signals WL<1>_a, WL<1>_b, and WL<1>_c, which are sequentially enabled in the enable period of the first word line enable signal WL<1> _en. In detail, the first voltage transfer signal WL<1>_a is enabled when the first word line enable signal WL<1> _en is enabled, and has an enable period of a length corresponding to the delay time of the first delay circuit 701. The second voltage transfer signal WL<1>_b is enabled when the first voltage transfer signal WL<1>_a is disabled, and is disabled when the first word line enable signal WL<1> _en is disabled. The third voltage transfer signal WL<1>_c is enabled before the first word line enable signal WL<1> _en is disabled, and is disabled when the first word line enable signal WL<1> _en is disabled.

For an embodiment, the second and third control signal generation circuits 800 and 900 are configured in the same manner as the first control signal generation circuit 700. Thus, the timing diagram of the first to third control signal generation circuits 700, 800, and 900 in the case where the refresh signal Refresh is enabled is illustrated as in FIG. 6.

In a refresh operation, that is, when the refresh signal Refresh is enabled, the first to third word line enable signals WL<1> _en, WL<2> _en, and WL<3> _en are sequentially enabled. For example, if the first word line enable signal WL<1> _en is disabled, then the second word line enable signal WL<2> _en is enabled. If the second word line enable signal WL<2> _en is disabled, then the third word line enable signal WL<3> _en is enabled.

In the enable period of the first word line enable signal WL<1> _en, the first to third voltage transfer signals WL<1>_a, WL<1>_b, and WL<1>_c are sequentially enabled. In detail, the first voltage transfer signal WL<1>_a is enabled when the first word line enable signal WL<1>_en is enabled. The second voltage transfer signal WL<1>_b is enabled when the first voltage transfer signal WL<1>_a is disabled. The third voltage transfer signal WL<1>_c is enabled before the first word line enable signal WL<1> _en is disabled. The second and third voltage transfer signals WL<1>_b and WL<1>_c are disabled when the first word line enable signal WL<1> _en is disabled.

In the enable period of the second word line enable signal WL<2> _en, the fourth to sixth voltage transfer signals WL<2>_a, WL<2>_b, and WL<2>_c are sequentially enabled. In detail, the fourth voltage transfer signal WL<2>_a is enabled when the second word line enable signal WL<2> _en is enabled. The fifth voltage transfer signal WL<2>_b is enabled when the fourth voltage transfer signal WL<2>_a is disabled. The sixth voltage transfer signal WL<2>_c is enabled before the second word line enable signal WL<2> _en is disabled. The fifth and sixth voltage transfer signals WL<2>_b and WL<2>_c are disabled when the second word line enable signal WL<2> _en is disabled.

In the enable period of the third word line enable signal WL<3> _en, the seventh to ninth voltage transfer signals WL<3>_a, WL<3>_b, and WL<3>_c are sequentially enabled. In detail, the seventh voltage transfer signal WL<3>_a is enabled when the third word line enable signal WL<3> _en is enabled. The eighth voltage transfer signal WL<3>_b is enabled when the seventh voltage transfer signal WL<3>_a is disabled. The ninth voltage transfer signal WL<3>_c is enabled before the third word line enable signal WL<3> _en is disabled. The eighth and ninth voltage transfer signals WL<3>_b and WL<3>_c are disabled when the third word line enable signal WL<3> _en is disabled.

The operation of the semiconductor memory apparatus 450 in accordance with an embodiment is described below with reference to FIGS. 4 and 6.

Figure 6:
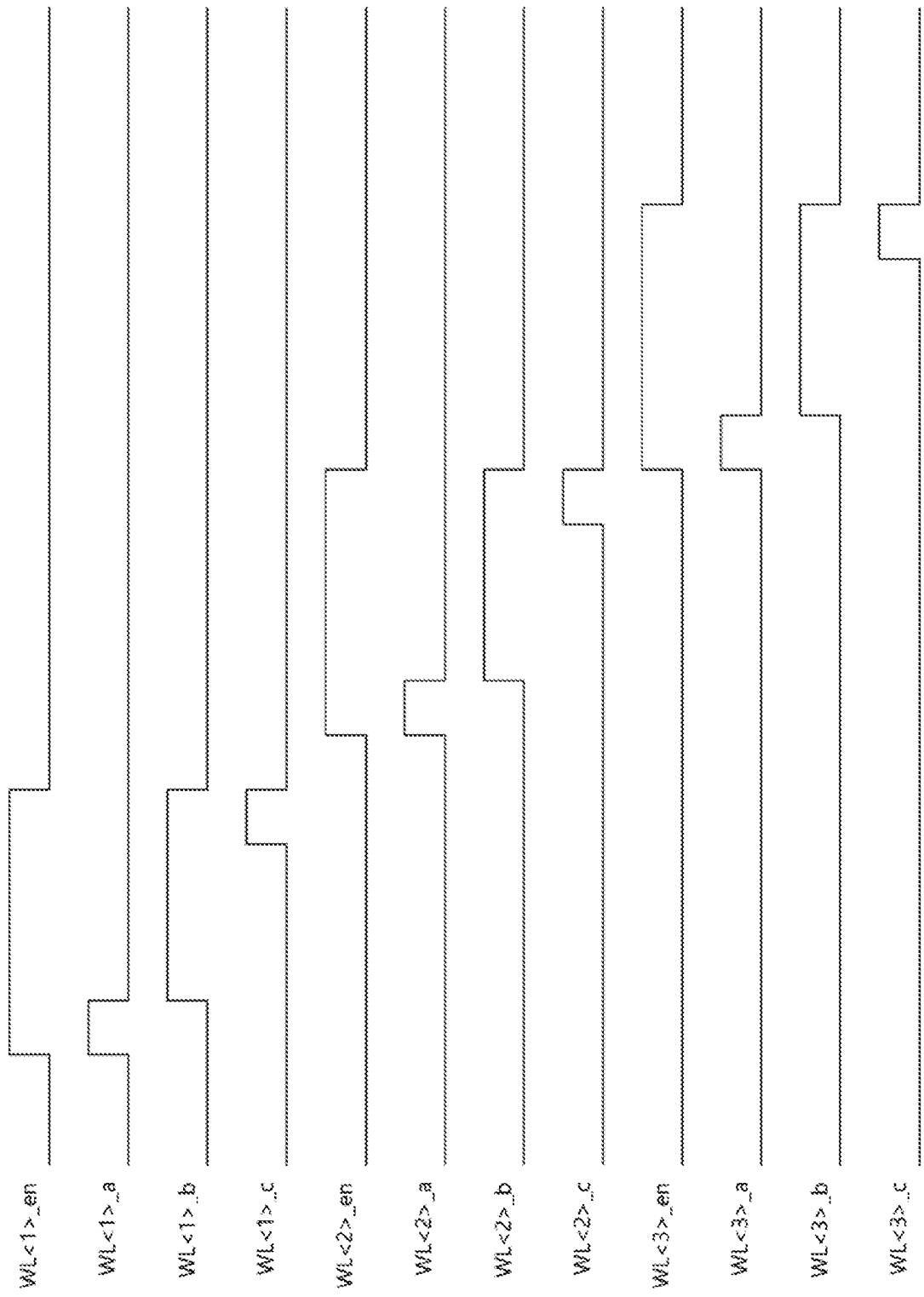
FIG. 6 shows a timing diagram for the semiconductor memory apparatus of FIG. 4.

As shown in FIG. 6, in a refresh operation of a DRAM device, that is, when the refresh signal Refresh is enabled, the first to third word line enable signals WL<1> _en, WL<2> _en, and WL<3> _en are sequentially enabled. Also, in the respective enable periods of the first to third word line enable signals WL<1> _en, WL<2> _en, and WL<3> _en, the first to ninth voltage transfer signals WL<1>_a, WL<1>_b, WL<1>_c, WL<2>_a, WL<2>_b, WL<2>_c, WL<3>_a, WL<3>_b, and WL<3>_c are sequentially enabled.

During the enable period of the first voltage transfer signal WL<1>_a, the first word line WL<1> and the first capacitor 400 are electrically coupled through the first switch 101. If the first word line WL<1> and the first capacitor 400 are coupled, then the charges charged in the first capacitor 400 are transferred to the first word line WL<1>. The first capacitor 400 is charged before a previous word line (not shown) is disabled.

If the second voltage transfer signal WL<1>_b is enabled, then the first driver 102 enables the first word line WL<1> by applying a driving voltage to the first word line WL<1>.

If the third voltage transfer signal WL<1>_c is enabled, then the first word line WL<1> and the second capacitor 500 are coupled through the second switch 103. The second capacitor 500 which is coupled with the enabled first word line WL<1> is charged.

If the first word line enable signal WL<1> _en is disabled, then the second and third voltage transfer signals WL<1>_b and WL<1>_c are disabled. If the second voltage transfer signal WL<1>_b is disabled, then the first word line WL<1> is discharged and disabled. If the third voltage transfer signal WL<1>_c is disabled, then the first word line WL<1> and the second capacitor 500 are electrically decoupled.

If the first word line enable signal WL<1> _en is disabled, then the second word line enable signal WL<2> _en is enabled.

If the second word line enable signal WL<2> _en is enabled, then the fourth voltage transfer signal WL<2>_a is enabled.

During a period in which the fourth voltage transfer signal WL<2>_a is enabled, the second word line WL<2> is electrically coupled with the second capacitor 500 through the third switch 201. The charges charged in the second capacitor 500 are transferred to the second word line WL<2>.

If the fourth voltage transfer signal WL<2>_a is disabled, then the second word line WL<2> and the second capacitor 500 are electrically decoupled. If the fourth voltage transfer signal WL<2>_a is disabled, then the fifth voltage transfer signal WL<2>_b is enabled.

If the fifth voltage transfer signal WL<2>_b is enabled, then the second word line WL<2> is applied with a driving voltage through the second driver 202 and is enabled.

The sixth voltage transfer signal WL<2>_c is enabled before the second word line enable signal WL<2> _en is disabled. If the sixth voltage transfer signal WL<2>_c is enabled, then the second word line WL<2> and the third capacitor 600 are electrically coupled through the fourth switch 203. If the second word line WL<2> and the third capacitor 600 are coupled, then charges having enabled the second word line WL<2> are transferred to the third capacitor 600, and thereby, the third capacitor 600 is charged.

If the second word line enable signal WL<2> _en is disabled, then the fifth and sixth voltage transfer signals WL<2>_b and WL<2>_c are disabled.

If the fifth voltage transfer signal WL<2>_b is disabled, then the second word line WL<2> is disabled. If the sixth voltage transfer signal WL<2>_c is disabled, then the second word line WL<2> and the third capacitor 600 are electrically decoupled.

If the second word line enable signal WL<2> _en is disabled, then the third word line enable signal WL<3> _en is enabled.

If the third word line enable signal WL<3> _en is enabled, then the seventh voltage transfer signal WL<3>_a is enabled. During a period in which the seventh voltage transfer signal WL<3>_a is enabled, the third word line WL<3> and the third capacitor 600 are coupled through the fifth switch 301. If the third word line WL<3> and the third capacitor 600 are coupled, then the charges charged in the third capacitor 600 are transferred to the third word line WL<3>.

If the seventh voltage transfer signal WL<3>_a is disabled, then the eighth voltage transfer signal WL<3>_b is enabled.

If the eighth voltage transfer signal WL<3>_b is enabled, then a driving voltage is applied to the third word line WL<3> through the third driver 302, and the third word line WL<3> applied with the driving voltage is enabled.

The ninth voltage transfer signal WL<3>_c is enabled before the third word line enable signal WL<3> _en is disabled.

If the ninth voltage transfer signal WL<3>_c is enabled, then the third word line WL<3> and the next capacitor are coupled through the sixth switch 303. As charges having enabled the third word line WL<3> are transferred to the coupled capacitor, the capacitor is charged.

If the third word line enable signal WL<3> _en is disabled, then the eighth and ninth voltage transfer signals WL<3>_b and WL<3>_c are disabled. If the eighth voltage transfer signal WL<3>_b is disabled, then the third word line WL<3> is discharged and disabled. If the ninth voltage transfer signal WL<3>_c is disabled, then the third word line WL<3> and the next capacitor are electrically decoupled.

In this way, in the semiconductor memory apparatus 450 in accordance with an embodiment, in a refresh operation in which word lines are sequentially enabled, charges enabling a word line are transferred to a capacitor and charge the capacitor before the enabled word line is disabled. Also, as the charges of the capacitor are transferred to a word line to be enabled, current or power otherwise consumed when the word line is enabled may be reduced.

Figure 7:
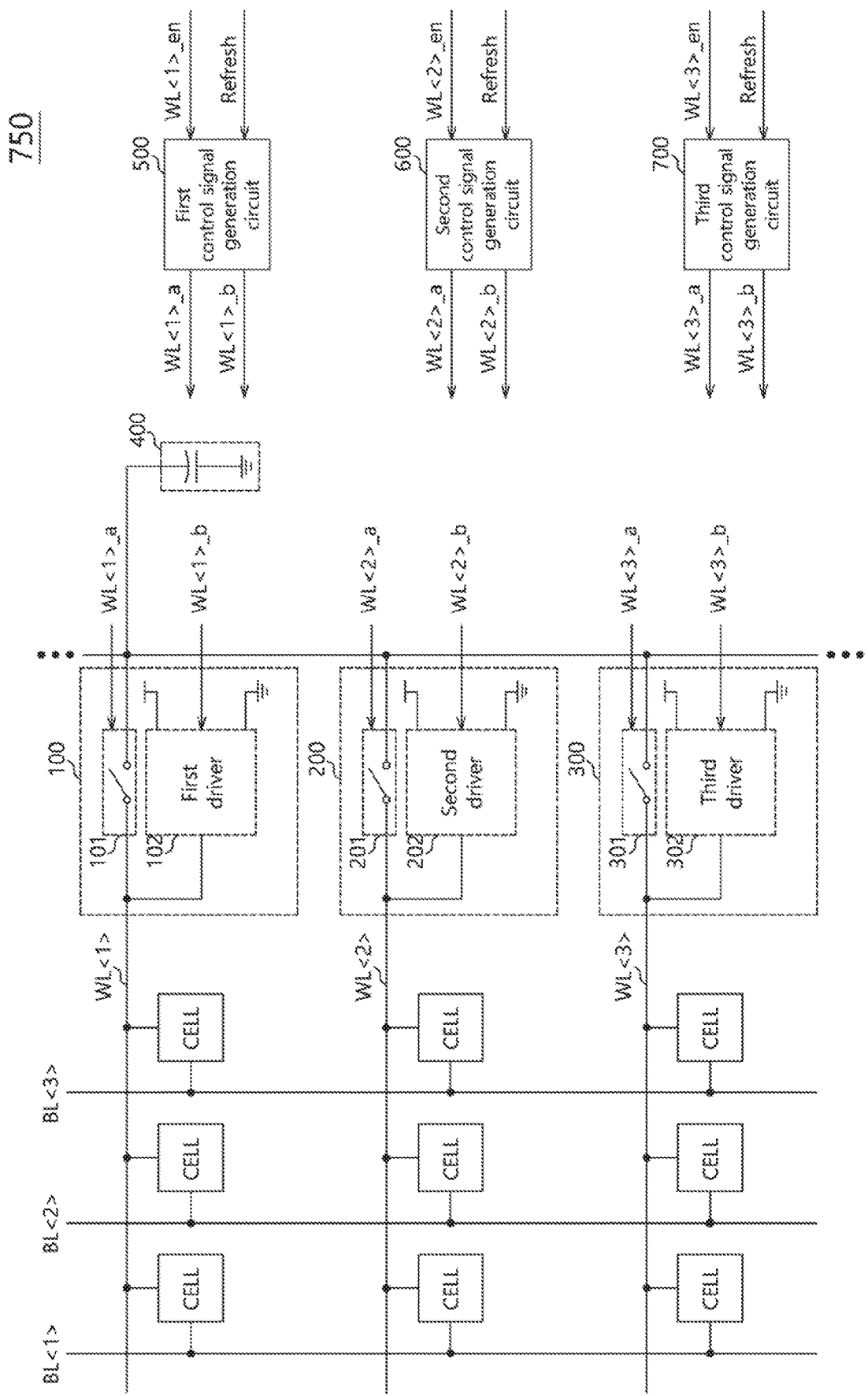
FIG. 7 shows a configuration diagram illustrating a semiconductor memory apparatus in accordance with an embodiment of the present teachings.

As shown in FIG. 7, a semiconductor memory apparatus 750 in accordance with another embodiment may include first to third word line control circuits 100, 200, and 300; a capacitor 400; and first to third control signal generation circuits 500, 600, and 700.

The semiconductor memory apparatus 750 may include a plurality of memory cells which are coupled to a plurality of bit lines and a plurality of word lines. For example, as shown in FIG. 7, memory cells CELL are disposed and coupled where first to third bit lines BL<1:3> intersect with first to third word lines WL<1:3>. For an embodiment, each memory cell CELL may include one transistor and one capacitor.

The first word line control circuit 100 may electrically couple or decouple the capacitor 400 and the first word line WL<1> in response to a first voltage transfer signal WL<1>_a. The first word line control circuit 100 may enable the first word line WL<1> by applying a driving voltage to the first word line WL<1> and may disable the first word line WL<1> by discharging the first word line WL<1>, depending on a second voltage transfer signal WL<1>_b.

The capacitor 400 may be coupled in common with the first to third word line control circuits 100, 200, and 300. The capacitor 400 has one end coupled in common with the first to third word line control circuits 100, 200, and 300. The other end of the capacitor 400 is coupled to a ground terminal.

The first word line control circuit 100 may include a first switch 101 and a first driver 102.

The first switch 101 may electrically couple or decouple the first word line WL<1> and the capacitor 400 in response to the first voltage transfer signal WL<1>_a. For example, the first switch 101 electrically couples the first word line WL<1> and the capacitor 400 when the first voltage transfer signal WL<1>_a is enabled. The first switch 101 electrically decouples the first word line WL<1> and the capacitor 400 when the first voltage transfer signal WL<1>_a is disabled.

The first driver 102 may enable or disable the first word line WL<1> in response to the second voltage transfer signal WL<1>_b. For example, the first driver 102 may enable the first word line WL<1> by applying a driving voltage to the first word line WL<1> when the second voltage transfer signal WL<1>_b is enabled. The first driver 102 may disable the first word line WL<1> by coupling the first word line WL<1> and a ground terminal when the second voltage transfer signal WL<1>_b is disabled.

The second word line control circuit 200 may electrically couple or decouple the capacitor 400 and the second word line WL<2> in response to a third voltage transfer signal WL<2>_a. The second word line control circuit 200 may enable the second word line WL<2> by applying a driving voltage to the second word line WL<2> and may disable the second word line WL<2> by discharging the second word line WL<2>, depending on a fourth voltage transfer signal WL<2>_b.

The second word line control circuit 200 may include a second switch 201 and a second driver 202. The second switch 201 may electrically couple or decouple the capacitor 400 with or from the second word line WL<2> in response to the third voltage transfer signal WL<2>_a. For example, the second switch 201 electrically couples the second word line WL<2> and the capacitor 400 when the third voltage transfer signal WL<2>_a is enabled. The second switch 201 electrically decouples the second word line WL<2> and the capacitor 400 when the third voltage transfer signal WL<2>_a is disabled.

The second driver 202 may enable or disable the second word line WL<2> in response to the fourth voltage transfer signal WL<2>_b. For example, the second driver 202 may enable the second word line WL<2> by applying a driving voltage to the second word line WL<2> when the fourth voltage transfer signal WL<2>_b is enabled. The second driver 202 may disable the second word line WL<2> by coupling the second word line WL<2> and a ground terminal when the fourth voltage transfer signal WL<2>_b is disabled.

The third word line control circuit 300 may electrically couple or decouple the capacitor 400 and the third word line WL<3> in response to a fifth voltage transfer signal WL<3>_a. The third word line control circuit 300 may enable the third word line WL<3> by applying a driving voltage to the third word line WL<3> and may disable the third word line WL<3> by discharging the third word line WL<3>, depending on a sixth voltage transfer signal WL<3>_b.

The third word line control circuit 300 may include a third switch 301 and a third driver 302. The third switch 301 may electrically couple or decouple the capacitor 400 with or from the third word line WL<3> in response to the fifth voltage transfer signal WL<3>_a. For example, the third switch 301 electrically couples the third word line WL<3> and the capacitor 400 when the fifth voltage transfer signal WL<3>_a is enabled. The third switch 301 electrically decouples the third word line WL<3> and the capacitor 400 when the fifth voltage transfer signal WL<3>_a is disabled.

The third driver 302 may enable or disable the third word line WL<3> in response to the sixth voltage transfer signal WL<3>_b. For example, the third driver 302 may enable the third word line WL<3> by applying a driving voltage to the third word line WL<3> when the sixth voltage transfer signal WL<3>_b is enabled. The third driver 302 may disable the third word line WL<3> by coupling the third word line WL<3> and a ground terminal when the sixth voltage transfer signal WL<3>_b is disabled.

The first control signal generation circuit 500 may generate the first and second voltage transfer signals WL<1>_a and WL<1>_b in response to a first word line enable signal WL<1> _en and a refresh signal Refresh. For example, when the refresh signal Refresh is disabled, the first control signal generation circuit 500 disables the first voltage transfer signal WL<1>_a regardless of the first word line enable signal WL<1> _en and outputs the first word line enable signal WL<1> _en as the second voltage transfer signal WL<1>_b. When the refresh signal Refresh and the first word line enable signal WL<1> _en are enabled, the first control signal generation circuit 500 enables the first voltage transfer signal WL<1>_a, enables the second voltage transfer signal WL<1>_b when the first voltage transfer signal WL<1>_a is disabled, and enables again the first voltage transfer signal WL<1>_a before the first word line enable signal WL<1> _en is disabled. In the case where the refresh signal Refresh is enabled, if the first word line enable signal WL<1> _en is disabled, the first control signal generation circuit 500 disables the first and second voltage transfer signals WL<1>_a and WL<1>_b.

The second control signal generation circuit 600 may generate the third and fourth voltage transfer signals WL<2>_a and WL<2>_b in response to a second word line enable signal WL<2> _en and the refresh signal Refresh. For example, when the refresh signal Refresh is disabled, the second control signal generation circuit 600 disables the third voltage transfer signal WL<2>_a regardless of the second word line enable signal WL<2> _en and outputs the second word line enable signal WL<2> _en as the fourth voltage transfer signal WL<2>_b. If the refresh signal Refresh is enabled, then the second control signal generation circuit 600 generates the third and fourth voltage transfer signals WL<2>_a and WL<2>_b in response to the second word line enable signal WL<2> _en. For example, when the second word line enable signal WL<2> _en is enabled, the second control signal generation circuit 600 enables the third voltage transfer signal WL<2>_a, enables the fourth voltage transfer signal WL<2>_b when the third voltage transfer signal WL<2>_a is disabled, and enables again the third voltage transfer signal WL<2>_a before the second word line enable signal WL<2> _en is disabled. In the case where the refresh signal Refresh is enabled, if the second word line enable signal WL<2> _en is disabled, the second control signal generation circuit 600 disables the third and fourth voltage transfer signals WL<2>_a and WL<2>_b.

The third control signal generation circuit 700 may generate the fifth and sixth voltage transfer signals WL<3>_a and WL<3>_b in response to a third word line enable signal WL<3> _en and the refresh signal Refresh. For example, when the refresh signal Refresh is disabled, the third control signal generation circuit 700 disables the fifth voltage transfer signal WL<3>_a regardless of the third word line enable signal WL<3> _en and outputs the third word line enable signal WL<3> _en as the sixth voltage transfer signal WL<3>_b. If the refresh signal Refresh is enabled, then the third control signal generation circuit 700 generates the fifth and sixth voltage transfer signals WL<3>_a and WL<3>_b in response to the third word line enable signal WL<3> _en. For example, when the third word line enable signal WL<3> _en is enabled, the third control signal generation circuit 700 enables the fifth voltage transfer signal WL<3>_a, enables the sixth voltage transfer signal WL<3>_b when the fifth voltage transfer signal WL<3>_a is disabled, and enables again the fifth voltage transfer signal WL<3>_a before the third word line enable signal WL<3> _en is disabled. In the case where the refresh signal Refresh is enabled, if the third word line enable signal WL<3> _en is disabled, the third control signal generation circuit 700 disables the fifth and sixth voltage transfer signals WL<3>_a and WL<3>_b.

If the refresh signal Refresh is disabled, then the respective first to third control signal generation circuits 500, 600, and 700 disable the first voltage transfer signal WL<1>_a, the third voltage transfer signal WL<2>_a, and the fifth voltage transfer signal WL<3>_a, and output the first to third word line enable signals WL<1> _en, WL<2> _en, and WL<3>_en as the second voltage transfer signal WL<1>_b, the fourth voltage transfer signal WL<2>_b, and the sixth voltage transfer signal WL<3>_b, respectively.

If the refresh signal Refresh is enabled, then the respective first to third control signal generation circuits 500, 600, and 700 generate the voltage transfer signals WL<1>_a, WL<1>_b, WL<2>_a, WL<2>_b, WL<3>_a, and WL<3>_b which are sequentially enabled in the enable periods of the word line enable signals WL<1> _en, WL<2> _en, and WL<3> _en.

For an embodiment, the first to third control signal generation circuits 500, 600, and 700 have the same configuration except that signals inputted to and and/or from the first to third control signal generation circuits 500, 600, and 700 are different. Therefore, a configuration of the first control signal generation circuit 500 is described, and descriptions for the configurations of the second and third control signal generation circuits 600 and 700 are omitted.

Figure 8:
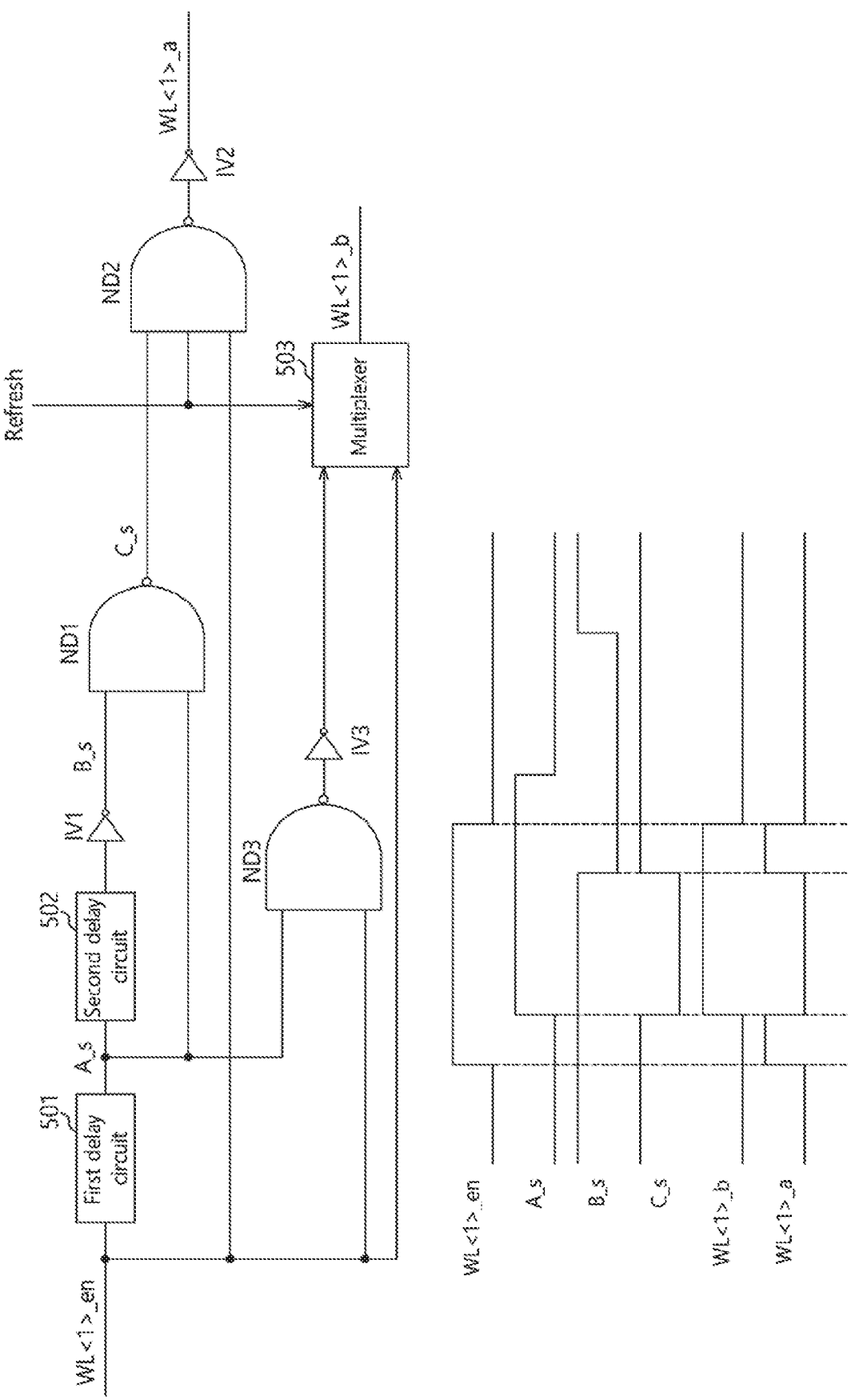
FIG. 8 shows a configuration diagram and a timing diagram for the first control signal generation circuit of FIG. 7.

As shown in FIG. 8, the first control signal generation circuit 500 may include first and second delay circuits 501 and 502; first to third NAND gates ND1, ND2, and ND3; first to third inverters IV1, IV2, and IV3; and a multiplexer 503. The first delay circuit 501 delays the first word line enable signal WL<1> _en and outputs a first signal A_s. The second delay circuit 502 delays the first signal A_s and outputs an output signal. The first inverter IV1 inverts the output signal of the second delay circuit 502 and outputs a second signal B_s. The first NAND gate ND1 receives the first and second signals A_s and B_s and outputs a third signal C_s. The second NAND gate ND2 receives the third signal C_s, the first word line enable signal WL<1> _en, and the refresh signal Refresh. The second inverter IV2 receives the output signal of the second NAND gate ND2 and outputs the first voltage transfer signal WL<1>_a. The third NAND gate ND3 receives the first signal A_s and the first word line enable signal WL<1> _en. The third inverter IV3 receives the output signal of the third NAND gate ND3. The multiplexer 503 outputs one of the output signal of the third inverter IV3 and the first word line enable signal WL<1> _en as the second voltage transfer signal WL<1>_b in response to the refresh signal Refresh. For example, the multiplexer 503 outputs the first word line enable signal WL<1> _en as the second voltage transfer signal WL<1>_b if the refresh signal Refresh is disabled. The multiplexer 503 outputs the output signal of the third inverter IV3 as the second voltage transfer signal WL<1>_b if the refresh signal Refresh is enabled.

The operation of the first control signal generation circuit 500 configured as indicated above, in the case where the refresh signal Refresh is disabled, is described below.

In the case where the refresh signal Refresh is disabled, the multiplexer 503 outputs the first word line enable signal WL<1> _en as the second voltage transfer signal WL<1>_b. In the case where the refresh signal Refresh is disabled, the first voltage transfer signal WL<1>_a is disabled regardless of the first word line enable signal WL<1> _en.

The operation of the first control signal generation circuit 500 in the case where the refresh signal Refresh is enabled is described below with reference to the timing diagram of FIG. 8.

The first delay circuit 501 delays the first word line enable signal WL<1> _en and outputs the first signal A_s. The combination of the second delay circuit 502 and the first inverter IV1 inverts and delays the first signal A_s and outputs the second signal B_s. With the refresh signal Refresh enabled, the first NAND gate ND1 outputs the third signal C_s of a low level in only a period in which both the first signal A_s and the second signal B_s are at high levels. With the refresh signal Refresh enabled, the combination of the second NAND gate ND2 and the second inverter IV2 outputs the first voltage transfer signal WL<1>_a of a high level in only a period in which both the third signal C_s and the first word line enable signal WL<1> _en are at high levels. With the refresh signal Refresh enabled, the combination of the third NAND gate ND3, the third inverter IV3 and the multiplexer 503 outputs the second voltage transfer signal WL<1>_b of a high level in a period in which both the first signal A_s and the first word line enable signal WL<1> _en are at the high levels.

Therefore, if the refresh signal Refresh is enabled, then the first control signal generation circuit 500 generates the first and second voltage transfer signals WL<1>_a and WL<1>_b which are sequentially enabled in the enable period of the first word line enable signal WL<1> _en. In detail, the first voltage transfer signal WL<1>_a is enabled when the first word line enable signal WL<1> _en is enabled. The second voltage transfer signal WL<1>_b is enabled when the first voltage transfer signal WL<1>_a is disabled. The first voltage transfer signal WL<1>_a is enabled again before the first word line enable signal WL<1> _en is disabled. The first and second voltage transfer signals WL<1>_a and WL<1>_b are disabled when the first word line enable signal WL<1> _en is disabled.

For an embodiment, the second and third control signal generation circuits 600 and 700 are configured in the same manner as the first control signal generation circuit 500. Thus, the timing diagram of the first to third control signal generation circuits 500, 600 and 700 in the case where the refresh signal Refresh is enabled is illustrated as in FIG. 9.

In a refresh operation, that is, when the refresh signal Refresh is enabled, the first to third word line enable signals WL<1> _en, WL<2> _en, and WL<3> _en are sequentially enabled. For example, if the first word line enable signal WL<1> _en is disabled, then the second word line enable signal WL<2> _en is enabled. If the second word line enable signal WL<2> _en is disabled, then the third word line enable signal WL<3> _en is enabled.

In the enable period of the first word line enable signal WL<1> _en, the first and second voltage transfer signals WL<1>_a and WL<1>_b are sequentially enabled. In detail, the first voltage transfer signal WL<1>_a is enabled when the first word line enable signal WL<1> _en is enabled. The second voltage transfer signal WL<1>_b is enabled when the first voltage transfer signal WL<1>_a is disabled. The first voltage transfer signal WL<1>_a is enabled again before the first word line enable signal WL<1> _en is disabled. The first and second voltage transfer signals WL<1>_a and WL<1>_b are disabled when the first word line enable signal WL<1> _en is disabled.

In the enable period of the second word line enable signal WL<2> _en, the third and fourth voltage transfer signals WL<2>_a and WL<2>_b are sequentially enabled. In detail, the third voltage transfer signal WL<2>_a is enabled when the second word line enable signal WL<2> _en is enabled. The fourth voltage transfer signal WL<2>_b is enabled when the third voltage transfer signal WL<2>_a is disabled. The third voltage transfer signal WL<2>_a is enabled again before the second word line enable signal WL<2> _en is disabled. The third and fourth voltage transfer signals WL<2>_a and WL<2>_b are disabled when the second word line enable signal WL<2> _en is disabled.

In the enable period of the third word line enable signal WL<3> _en, the fifth and sixth voltage transfer signals WL<3>_a and WL<3>_b are sequentially enabled. In detail, the fifth voltage transfer signal WL<3>_a is enabled when the third word line enable signal WL<3> _en is enabled. The sixth voltage transfer signal WL<3>_b is enabled when the fifth voltage transfer signal WL<3>_a is disabled. The fifth voltage transfer signal WL<3>_a is enabled again before the third word line enable signal WL<3> _en is disabled. The fifth and sixth voltage transfer signals WL<3>_a and WL<3>_b are disabled when the third word line enable signal WL<3> _en is disabled.

The operation of the semiconductor memory apparatus 750 in accordance with an embodiment is described below with reference to FIGS. 7 and 9.

Figure 9:
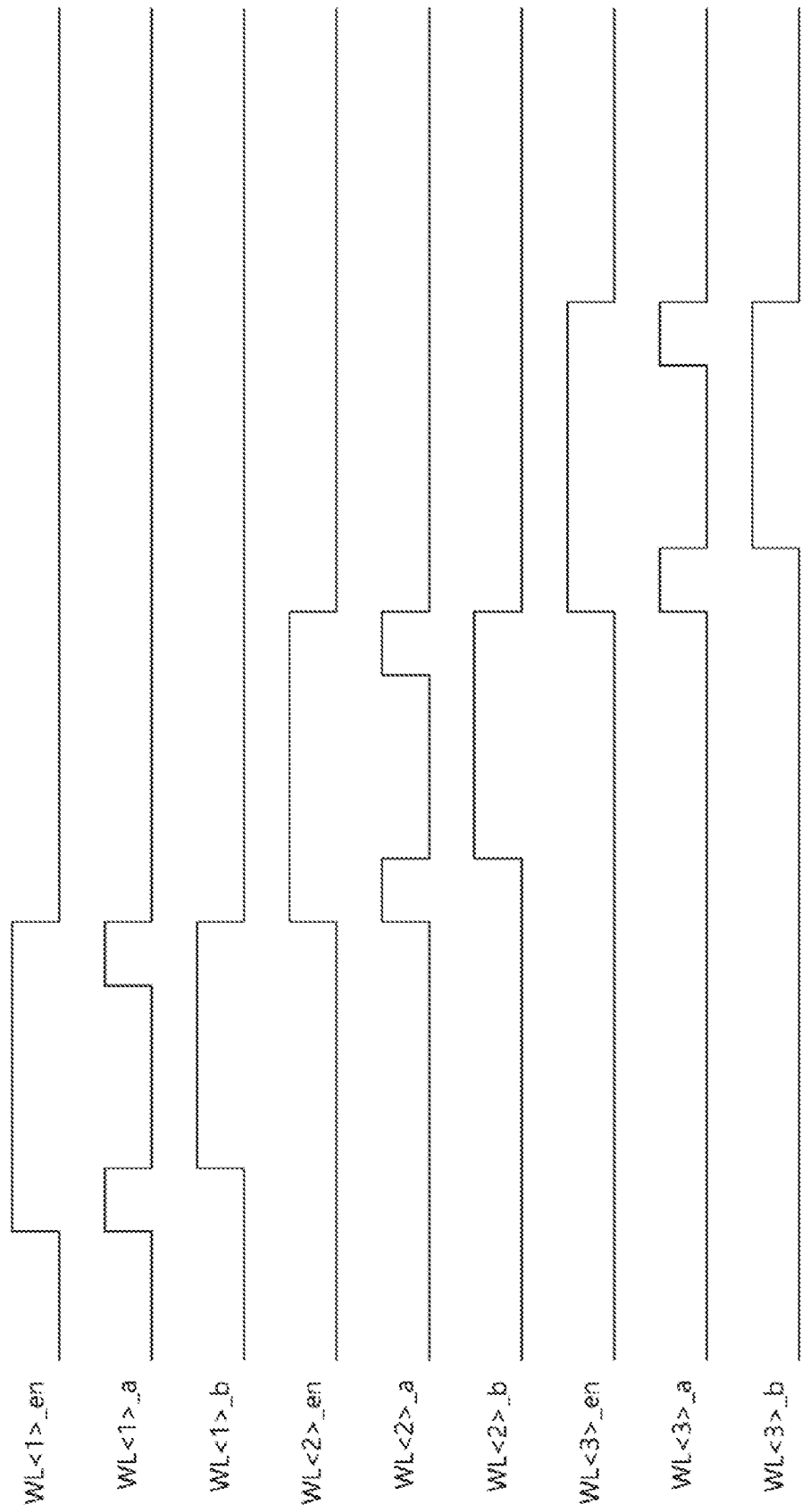
FIG. 9 shows a timing diagram for the semiconductor memory apparatus of FIG. 7.

As shown in FIG. 9, in a refresh operation, that is, when the refresh signal Refresh is enabled, the first to third word line enable signals WL<1> _en, WL<2> _en, and WL<3> _en are sequentially enabled. Also, in the respective enable periods of the first to third word line enable signals WL<1> _en, WL<2> _en, and WL<3> _en, the first to sixth voltage transfer signals WL<1>_a, WL<1>_b, WL<2>_a, WL<2>_b, WL<3>_a, and WL<3>_b are sequentially enabled.

During the enable period of the first voltage transfer signal WL<1>_a, the first word line WL<1> and the capacitor 400 are electrically coupled through the first switch 101. If the first word line WL<1> and the capacitor 400 are coupled, then the charges charged in the capacitor 400 are transferred to the first word line WL<1>.

If the second voltage transfer signal WL<1>_b is enabled, then the first driver 102 enables the first word line WL<1> by applying a driving voltage to the first word line WL<1>.

When the first voltage transfer signal WL<1>_a is enabled again, the first word line WL<1> and the capacitor 400 are coupled through the first switch 101. The capacitor 400 which is coupled with the enabled first word line WL<1> is charged.

If the first word line enable signal WL<1> _en is disabled, then the first and second voltage transfer signals WL<1>_a and WL<1>_b are disabled. If the second voltage transfer signal WL<1>_b is disabled, then the first word line WL<1> is discharged and disabled. If the first voltage transfer signal WL<1>_a is disabled, then the first word line WL<1> and the capacitor 400 are electrically decoupled.

If the first word line enable signal WL<1> _en is disabled, then the second word line enable signal WL<2> _en is enabled.

If the second word line enable signal WL<2> _en is enabled, then the third voltage transfer signal WL<2>_a is enabled.

During a period in which the third voltage transfer signal WL<2>_a is enabled, the second word line WL<2> is electrically coupled with the capacitor 400 through the second switch 201. The charges charged in the capacitor 400 are transferred to the second word line WL<2>.

If the third voltage transfer signal WL<2>_a is disabled, then the second word line WL<2> and the capacitor 400 are electrically decoupled. If the third voltage transfer signal WL<2>_a is disabled, then the fourth voltage transfer signal WL<2>_b is enabled.

If the fourth voltage transfer signal WL<2>_b is enabled, then the second word line WL<2> is applied with a driving voltage through the second driver 202 and is enabled.

The third voltage transfer signal WL<2>_a is enabled again before the second word line enable signal WL<2> _en is disabled.

When the third voltage transfer signal WL<2>_a is enabled again, the second word line WL<2> and the capacitor 400 are electrically coupled through the second switch 201. If the second word line WL<2> and the capacitor 400 are coupled, then charges having enabled the second word line WL<2> are transferred to the capacitor 400, and thereby, the capacitor 400 is charged.

If the second word line enable signal WL<2> _en is disabled, then the third and fourth voltage transfer signals WL<2>_a and WL<2>_b are disabled.

If the fourth voltage transfer signal WL<2>_b is disabled, then the second word line WL<2> is disabled. If the third voltage transfer signal WL<2>_a is disabled, then the second word line WL<2> and the capacitor 400 are electrically decoupled.

If the second word line enable signal WL<2> _en is disabled, then the third word line enable signal WL<3> _en is enabled.

If the third word line enable signal WL<3> _en is enabled, then the fifth voltage transfer signal WL<3>_a is enabled. During a period in which the fifth voltage transfer signal WL<3>_a is enabled, the third word line WL<3> and the capacitor 400 are coupled through the third switch 301. If the third word line WL<3> and the capacitor 400 are coupled, then the charges charged in the capacitor 400 are transferred to the third word line WL<3>.

If the fifth voltage transfer signal WL<3>_a is disabled, then the sixth voltage transfer signal WL<3>_b is enabled.

If the sixth voltage transfer signal WL<3>_b is enabled, then a driving voltage is applied to the third word line WL<3> through the third driver 302, and the third word line WL<3> applied with the driving voltage is enabled.

The fifth voltage transfer signal WL<3>_a is enabled again before the third word line enable signal WL<3>_en is disabled.

When the fifth voltage transfer signal WL<3>_a is enabled again, the third word line WL<3> and the capacitor 400 are coupled through the third switch 301. As charges having enabled the third word line WL<3> are transferred to the capacitor 400, the capacitor 400 is charged.

If the third word line enable signal WL<3>_en is disabled, then the fifth and sixth voltage transfer signals WL<3>_a and WL<3>_b are disabled. If the sixth voltage transfer signal WL<3>_b is disabled, then the third word line WL<3> is discharged and disabled. If the fifth voltage transfer signal WL<3>_a is disabled, then the third word line WL<3> and the capacitor 400 are electrically decoupled.

In this way, in the semiconductor memory apparatus 750 in accordance with an embodiment, in a refresh operation in which word lines are sequentially enabled, charges enabling a word line are transferred to a capacitor and charge the capacitor before the enabled word line is disabled. Also, as the charges of the capacitor are transferred to a word line to be enabled, current or power otherwise consumed when the word line is enabled may be reduced.

Figure 10:
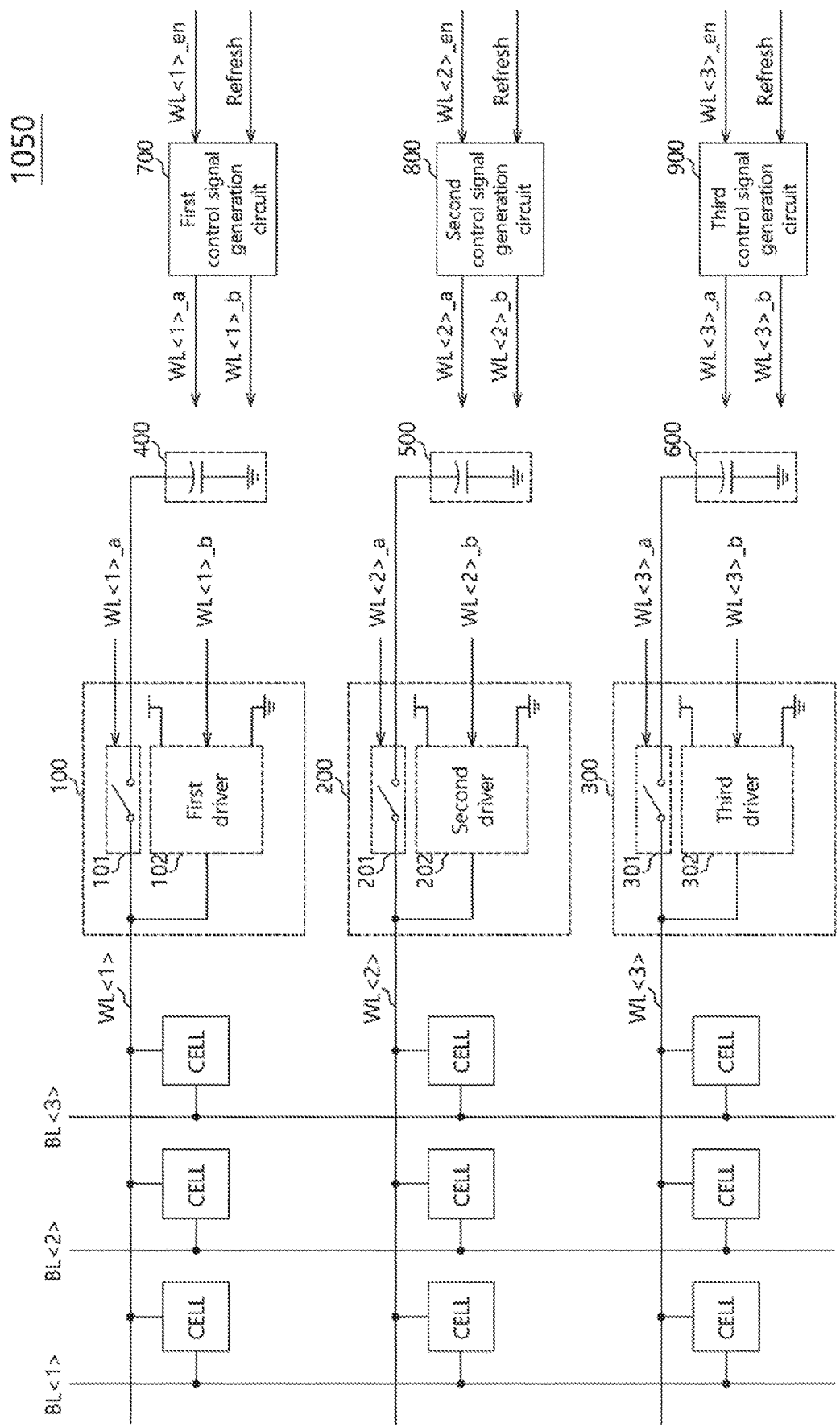
FIG. 10 shows a configuration diagram illustrating a semiconductor memory apparatus in accordance with an embodiment of the present teachings.

As shown in FIG. 10, a semiconductor memory apparatus 1050 in accordance with another embodiment may include first to third word line control circuits 100, 200, and 300; first to third capacitors 400, 500, and 600; and first to third control signal generation circuits 700, 800, and 900.

The semiconductor memory apparatus 1050 may include a plurality of memory cells which are coupled to a plurality of bit lines and a plurality of word lines. For example, as shown in FIG. 10, memory cells CELL are disposed and coupled where first to third bit lines BL<1:3> intersect with first to third word lines WL<1:3>. For an embodiment, each memory cell CELL may include one transistor and one capacitor.

The first word line control circuit 100 may electrically couple or decouple the first capacitor 400 and the first word line WL<1> in response to a first voltage transfer signal WL<1>_a. The first word line control circuit 100 may enable the first word line WL<1> by applying a driving voltage to the first word line WL<1> and may disable the first word line WL<1> by discharging the first word line WL<1>, depending on a second voltage transfer signal WL<1>_b.

The first capacitor 400 may be coupled with the first word line control circuit 100. The first capacitor 400 has one end to which the first word line control circuit 100 is coupled and the other end to which a ground terminal is coupled.

The first word line control circuit 100 may include a first switch 101 and a first driver 102.

The first switch 101 may electrically couple or decouple the first word line WL<1> and the first capacitor 400 in response to the first voltage transfer signal WL<1>_a. For example, the first switch 101 electrically couples the first word line WL<1> and the first capacitor 400 when the first voltage transfer signal WL<1>_a is enabled. The first switch 101 electrically decouples the first word line WL<1> and the first capacitor 400 when the first voltage transfer signal WL<1>_a is disabled.

The first driver 102 may enable or disable the first word line WL<1> in response to the second voltage transfer signal WL<1>_b. For example, the first driver 102 may enable the first word line WL<1> by applying a driving voltage to the first word line WL<1> when the second voltage transfer signal WL<1>_b is enabled. The first driver 102 may disable the first word line WL<1> by coupling the first word line WL<1> and a ground terminal when the second voltage transfer signal WL<1>_b is disabled.

The second word line control circuit 200 may electrically couple or decouple the second capacitor 500 and the second word line WL<2> in response to a third voltage transfer signal WL<2>_a. The second word line control circuit 200 may enable the second word line WL<2> by applying a driving voltage to the second word line WL<2> and may disable the second word line WL<2> by discharging the second word line WL<2>, depending on a fourth voltage transfer signal WL<2>_b.

The second word line control circuit 200 may include a second switch 201 and a second driver 202. The second switch 201 may electrically couple or decouple the second capacitor 500 with or from the second word line WL<2> in response to the third voltage transfer signal WL<2>_a. For example, the second switch 201 electrically couples the second word line WL<2> and the second capacitor 500 when the third voltage transfer signal WL<2>_a is enabled. The second switch 201 electrically decouples the second word line WL<2> and the second capacitor 500 when the third voltage transfer signal WL<2>_a is disabled.

The second driver 202 may enable or disable the second word line WL<2> in response to the fourth voltage transfer signal WL<2>_b. For example, the second driver 202 may enable the second word line WL<2> by applying a driving voltage to the second word line WL<2> when the fourth voltage transfer signal WL<2>_b is enabled. The second driver 202 may disable the second word line WL<2> by coupling the second word line WL<2> and a ground terminal when the fourth voltage transfer signal WL<2>_b is disabled.

The third word line control circuit 300 may electrically couple or decouple the third capacitor 600 and the third word line WL<3> in response to a fifth voltage transfer signal WL<3>_a. The third word line control circuit 300 may enable the third word line WL<3> by applying a driving voltage to the third word line WL<3> and may disable the third word line WL<3> by discharging the third word line WL<3>, depending on a sixth voltage transfer signal WL<3>_b.

The third word line control circuit 300 may include a third switch 301 and a third driver 302. The third switch 301 may electrically couple or decouple the third capacitor 600 with or from the third word line WL<3> in response to the fifth voltage transfer signal WL<3>_a. For example, the third switch 301 electrically couples the third word line WL<3> and the third capacitor 600 when the fifth voltage transfer signal WL<3>_a is enabled. The third switch 301 electrically decouples the third word line WL<3> and the third capacitor 600 when the fifth voltage transfer signal WL<3>_a is disabled.

The third driver 302 may enable or disable the third word line WL<3> in response to the sixth voltage transfer signal WL<3>_b. For example, the third driver 302 may enable the third word line WL<3> by applying a driving voltage to the third word line WL<3> when the sixth voltage transfer signal WL<3>_b is enabled. The third driver 302 may disable the third word line WL<3> by coupling the third word line WL<3> and a ground terminal when the sixth voltage transfer signal WL<3>_b is disabled.

The first control signal generation circuit 700 may generate the first and second voltage transfer signals WL<1>_a and WL<1>_b in response to a first word line enable signal WL<1> _en and a refresh signal Refresh. For example, when the refresh signal Refresh is disabled, the first control signal generation circuit 700 disables the first voltage transfer signal WL<1>_a regardless of the first word line enable signal WL<1> _en and outputs the first word line enable signal WL<1> _en as the second voltage transfer signal WL<1>_b. When the refresh signal Refresh and the first word line enable signal WL<1> _en are enabled, the first control signal generation circuit 700 enables the first voltage transfer signal WL<1>_a, enables the second voltage transfer signal WL<1>_b when the first voltage transfer signal WL<1>_a is disabled, and enables again the first voltage transfer signal WL<1>_a before the first word line enable signal WL<1> _en is disabled. In the case where the refresh signal Refresh is enabled, if the first word line enable signal WL<1> _en is disabled, the first control signal generation circuit 700 disables the first and second voltage transfer signals WL<1>_a and WL<1>_b.

The second control signal generation circuit 800 may generate the third and fourth voltage transfer signals WL<2>_a and WL<2>_b in response to a second word line enable signal WL<2> _en and the refresh signal Refresh. For example, when the refresh signal Refresh is disabled, the second control signal generation circuit 800 disables the third voltage transfer signal WL<2>_a regardless of the second word line enable signal WL<2> _en and outputs the second word line enable signal WL<2> _en as the fourth voltage transfer signal WL<2>_b. If the refresh signal Refresh is enabled, then the second control signal generation circuit 800 generates the third and fourth voltage transfer signals WL<2>_a and WL<2>_b in response to the second word line enable signal WL<2> _en. For example, when the second word line enable signal WL<2> _en is enabled, the second control signal generation circuit 800 enables the third voltage transfer signal WL<2>_a, enables the fourth voltage transfer signal WL<2>_b when the third voltage transfer signal WL<2>_a is disabled, and enables again the third voltage transfer signal WL<2>_a before the second word line enable signal WL<2> _en is disabled. In the case where the refresh signal Refresh is enabled, if the second word line enable signal WL<2> _en is disabled, the second control signal generation circuit 800 disables the third and fourth voltage transfer signals WL<2>_a and WL<2>_b.

The third control signal generation circuit 900 may generate the fifth and sixth voltage transfer signals WL<3>_a and WL<3>_b in response to a third word line enable signal WL<3> _en and the refresh signal Refresh. For example, when the refresh signal Refresh is disabled, the third control signal generation circuit 900 disables the fifth voltage transfer signal WL<3>_a regardless of the third word line enable signal WL<3> _en and outputs the third word line enable signal WL<3> _en as the sixth voltage transfer signal WL<3>_b. If the refresh signal Refresh is enabled, then the third control signal generation circuit 900 generates the fifth and sixth voltage transfer signals WL<3>_a and WL<3>_b in response to the third word line enable signal WL<3> _en. For example, when the third word line enable signal WL<3> _en is enabled, the third control signal generation circuit 900 enables the fifth voltage transfer signal WL<3>_a, enables the sixth voltage transfer signal WL<3>_b when the fifth voltage transfer signal WL<3>_a is disabled, and enables again the fifth voltage transfer signal WL<3>_a before the third word line enable signal WL<3> _en is disabled. In the case where the refresh signal Refresh is enabled, if the third word line enable signal WL<3> _en is disabled, the third control signal generation circuit 900 disables the fifth and sixth voltage transfer signals WL<3>_a and WL<3>_b.

If the refresh signal Refresh is disabled, then the respective first to third control signal generation circuits 700, 800, and 900 disable the first voltage transfer signal WL<1>_a, the third voltage transfer signal WL<2>_a and the fifth voltage transfer signal WL<3>_a, and output the first to third word line enable signals WL<1> _en, WL<2> _en, and WL<3> _en as the second voltage transfer signal WL<1>_b, the fourth voltage transfer signal WL<2>_b and the sixth voltage transfer signal WL<3>_b, respectively.

If the refresh signal Refresh is enabled, then the respective first to third control signal generation circuits 700, 800, and 900 generate the voltage transfer signals WL<1>_a, WL<1>_b, WL<2>_a, WL<2>_b, WL<3>_a, and WL<3>_b which are sequentially enabled in the enable periods of the word line enable signals WL<1> _en, WL<2> _en, and WL<3> _en.

For an embodiment, the first to third control signal generation circuits 700, 800, and 900 have the same configuration except that signals inputted thereto and outputted therefrom are different. Therefore, a configuration of the first control signal generation circuit 700 is described, and descriptions for the configurations of the remaining control signal generation circuits 800 and 900 are omitted.

For an embodiment, the first control signal generation circuit 700 shown in FIG. 10 is configured in the same manner as the first control signal generation circuit 500 shown in FIG. 7. Therefore, the first control signal generation circuit 700 shown in FIG. 10 may be configured as shown in FIG. 8.

The first control signal generation circuit 700 may include first and second delay circuits 501 and 502; first to third NAND gates ND1, ND2, and ND3; first to third inverters IV1, IV2, and IV3; and a multiplexer 503. The first delay circuit 501 delays the first word line enable signal WL<1> _en and outputs a first signal A_s. The second delay circuit 502 delays the first signal A_s and outputs an output signal. The first inverter IV1 inverts the output signal of the second delay circuit 502 and outputs a second signal B_s. The first NAND gate ND1 receives the first and second signals A_s and B_s and outputs a third signal C_s. The second NAND gate ND2 receives the third signal C_s, the first word line enable signal WL<1> _en, and the refresh signal Refresh. The second inverter IV2 receives the output signal of the second NAND gate ND2, and outputs the first voltage transfer signal WL<1>_a. The third NAND gate ND3 receives the first signal A_s and the first word line enable signal WL<1> _en. The third inverter IV3 receives the output signal of the third NAND gate ND3. The multiplexer 503 outputs one of the output signal of the third inverter IV3 and the first word line enable signal WL<1> _en as the second voltage transfer signal WL<1>_b in response to the refresh signal Refresh. For example, the multiplexer 503 outputs the first word line enable signal WL<1> _en as the second voltage transfer signal WL<1>_b if the refresh signal Refresh is disabled. The multiplexer outputs the output signal of the third inverter IV3 as the second voltage transfer signal WL<1>_b if the refresh signal Refresh is enabled.

The operation of the first control signal generation circuit 700 configured as indicated above, in the case where the refresh signal Refresh is disabled, is described below.

In the case where the refresh signal Refresh is disabled, the multiplexer 503 outputs the first word line enable signal WL<1> _en as the second voltage transfer signal WL<1>_b. In the case where the refresh signal Refresh is disabled, the first voltage transfer signal WL<1>_a is disabled regardless of the first word line enable signal WL<1> _en.

The operation of the first control signal generation circuit 700 in the case where the refresh signal Refresh is enabled is described below with reference to the timing diagram of FIG. 8.

The first delay circuit 501 delays the first word line enable signal WL<1> _en and outputs the first signal A_s. The combination of the second delay circuit 502 and the first inverter IV1 inverts and delays the first signal A_s and outputs the second signal B_s. With the refresh signal Refresh enabled, the first NAND gate ND1 outputs the third signal C_s of a low level in only a period in which both the first signal A_s and the second signal B_s are at high levels. With the refresh signal Refresh enabled, the combination of the second NAND gate ND2 and the second inverter IV2 outputs the first voltage transfer signal WL<1>_a of a high level in only a period in which both the third signal C_s and the first word line enable signal WL<1> _en are at high levels. With the refresh signal Refresh enabled, the combination of the third NAND gate ND3, the third inverter IV3 and the multiplexer 503 outputs the second voltage transfer signal WL<1>_b of a high level in a period in which both the first signal A_s and the first word line enable signal WL<1> _en are at the high levels.

Therefore, if the refresh signal Refresh is enabled, then the first control signal generation circuit 700 generates the first and second voltage transfer signals WL<1>_a and WL<1>_b which are sequentially enabled in the enable period of the first word line enable signal WL<1> _en. In detail, the first voltage transfer signal WL<1>_a is enabled when the first word line enable signal WL<1> _en is enabled. The second voltage transfer signal WL<1>_b is enabled when the first voltage transfer signal WL<1>_a is disabled. The first voltage transfer signal WL<1>_a is enabled again before the first word line enable signal WL<1>_en is disabled. The first and second voltage transfer signals WL<1>_a and WL<1>_b are disabled when the first word line enable signal WL<1> _en is disabled.

For an embodiment, the second and third control signal generation circuits 800 and 900 are configured in the same manner as the first control signal generation circuit 700. Thus, the timing diagram of the first to third control signal generation circuits 700, 800 and 900 in the case where the refresh signal Refresh is enabled is illustrated as in FIG. 9.

In a refresh operation, that is, when the refresh signal Refresh is enabled, the first to third word line enable signals WL<1> _en, WL<2> _en, and WL<3> _en are sequentially enabled. For example, if the first word line enable signal WL<1> _en is disabled, then the second word line enable signal WL<2> _en is enabled. If the second word line enable signal WL<2> _en is disabled, then the third word line enable signal WL<3> _en is enabled.

In the enable period of the first word line enable signal WL<1> _en, the first and second voltage transfer signals WL<1>_a and WL<1>_b are sequentially enabled. In detail, the first voltage transfer signal WL<1>_a is enabled when the first word line enable signal WL<1> _en is enabled. The second voltage transfer signal WL<1>_b is enabled when the first voltage transfer signal WL<1>_a is disabled. The first voltage transfer signal WL<1>_a is enabled again before the first word line enable signal WL<1> _en is disabled. The first and second voltage transfer signals WL<1>_a and WL<1>_b are disabled when the first word line enable signal WL<1> _en is disabled.

In the enable period of the second word line enable signal WL<2> _en, the third and fourth voltage transfer signals WL<2>_a and WL<2>_b are sequentially enabled. In detail, the third voltage transfer signal WL<2>_a is enabled when the second word line enable signal WL<2> _en is enabled. The fourth voltage transfer signal WL<2>_b is enabled when the third voltage transfer signal WL<2>_a is disabled. The third voltage transfer signal WL<2>_a is enabled again before the second word line enable signal WL<2> _en is disabled. The third and fourth voltage transfer signals WL<2>_a and WL<2>_b are disabled when the second word line enable signal WL<2> _en is disabled.

In the enable period of the third word line enable signal WL<3> _en, the fifth and sixth voltage transfer signals WL<3>_a and WL<3>_b are sequentially enabled. In detail, the fifth voltage transfer signal WL<3>_a is enabled when the third word line enable signal WL<3> _en is enabled. The sixth voltage transfer signal WL<3>_b is enabled when the fifth voltage transfer signal WL<3>_a is disabled. The fifth voltage transfer signal WL<3>_a is enabled again before the third word line enable signal WL<3> _en is disabled. The fifth and sixth voltage transfer signals WL<3>_a and WL<3>_b are disabled when the third word line enable signal WL<3> _en is disabled.

The operation of the semiconductor memory apparatus 1050 in accordance with an embodiment is described below with reference to FIGS. 9 and 10.

As shown in FIG. 9, in a refresh operation, that is, when the refresh signal Refresh is enabled, the first to third word line enable signals WL<1> _en, WL<2> _en, and WL<3> _en are sequentially enabled. Also, in the respective enable periods of the first to third word line enable signals WL<1> _en, WL<2> _en, and WL<3> _en, the first to sixth voltage transfer signals WL<1>_a, WL<1>_b, WL<2>_a, WL<2>_b, WL<3>_a, and WL<3>_b are sequentially enabled.

During the enable period of the first voltage transfer signal WL<1>_a, the first word line WL<1> and the first capacitor 400 are electrically coupled through the first switch 101. If the first word line WL<1> and the first capacitor 400 are coupled, then the charges charged in the first capacitor 400 are transferred to the first word line WL<1>.

If the second voltage transfer signal WL<1>_b is enabled, then the first driver 102 enables the first word line WL<1> by applying a driving voltage to the first word line WL<1>.

When the first voltage transfer signal WL<1>_a is enabled again, the first word line WL<1> and the first capacitor 400 are coupled through the first switch 101. The first capacitor 400 which is coupled with the enabled first word line WL<1> is charged.

If the first word line enable signal WL<1> _en is disabled, then the first and second voltage transfer signals WL<1>_a and WL<1>_b are disabled. If the second voltage transfer signal WL<1>_b is disabled, then the first word line WL<1> is discharged and disabled. If the first voltage transfer signal WL<1>_a is disabled, then the first word line WL<1> and the first capacitor 400 are electrically decoupled.

If the first word line enable signal WL<1> _en is disabled, then the second word line enable signal WL<2> _en is enabled.

If the second word line enable signal WL<2> _en is enabled, then the third voltage transfer signal WL<2>_a is enabled.

During a period in which the third voltage transfer signal WL<2>_a is enabled, the second word line WL<2> is electrically coupled with the second capacitor 500 through the second switch 201. The charges charged in the second capacitor 500 are transferred to the second word line WL<2>.

If the third voltage transfer signal WL<2>_a is disabled, then the second word line WL<2> and the second capacitor 500 are electrically decoupled. If the third voltage transfer signal WL<2>_a is disabled, then the fourth voltage transfer signal WL<2>_b is enabled.

If the fourth voltage transfer signal WL<2>_b is enabled, then the second word line WL<2> is applied with a driving voltage through the second driver 202 and is enabled.

The third voltage transfer signal WL<2>_a is enabled again before the second word line enable signal WL<2>_en is disabled.

When the third voltage transfer signal WL<2>_a is enabled again, the second word line WL<2> and the second capacitor 500 are electrically coupled through the second switch 201. If the second word line WL<2> and the second capacitor 500 are coupled, then charges having enabled the second word line WL<2> are transferred to the second capacitor 500, and thereby, the second capacitor 500 is charged.

If the second word line enable signal WL<2>_en is disabled, then the third and fourth voltage transfer signals WL<2>_a and WL<2>_b are disabled.

If the fourth voltage transfer signal WL<2>_b is disabled, then the second word line WL<2> is disabled. If the third voltage transfer signal WL<2>_a is disabled, then the second word line WL<2> and the second capacitor 500 are electrically decoupled.

If the second word line enable signal WL<2>_en is disabled, then the third word line enable signal WL<3>_en is enabled.

If the third word line enable signal WL<3>_en is enabled, then the fifth voltage transfer signal WL<3>_a is enabled. During a period in which the fifth voltage transfer signal WL<3>_a is enabled, the third word line WL<3> and the third capacitor 600 are coupled through the third switch 301. If the third word line WL<3> and the third capacitor 600 are coupled, then the charges charged in the third capacitor 600 are transferred to the third word line WL<3>.

If the fifth voltage transfer signal WL<3>_a is disabled, then the sixth voltage transfer signal WL<3>_b is enabled.

If the sixth voltage transfer signal WL<3>_b is enabled, then a driving voltage is applied to the third word line WL<3> through the third driver 302, and the third word line WL<3> applied with the driving voltage is enabled.

The fifth voltage transfer signal WL<3>_a is enabled again before the third word line enable signal WL<3>_en is disabled.

When the fifth voltage transfer signal WL<3>_a is enabled again, the third word line WL<3> and the third capacitor 600 are coupled through the third switch 301. As charges having enabled the third word line WL<3> are transferred to the third capacitor 600, the third capacitor 600 is charged.

If the third word line enable signal WL<3>_en is disabled, then the fifth and sixth voltage transfer signals WL<3>_a and WL<3>_b are disabled. If the sixth voltage transfer signal WL<3>_b is disabled, then the third word line WL<3> is discharged and disabled. If the fifth voltage transfer signal WL<3>_a is disabled, then the third word line WL<3> and the third capacitor 600 are electrically decoupled.

In this way, in the semiconductor memory apparatus 1050 in accordance an embodiment, in a refresh operation in which word lines are sequentially enabled, charges enabling a word line are transferred to a capacitor and charge the capacitor before the enabled word line is disabled. Also, as the charges of the capacitor are transferred to a word line to be enabled, current or power otherwise consumed when the word line is enabled may be reduced.

While various embodiments have been described above, it will be understood to those skilled in the art that the described embodiments represent only a limited number of possible embodiments. Therefore, a semiconductor memory apparatus in accordance with the present teachings should not be limited based on the described embodiments.

What is claimed is:

1. A semiconductor memory apparatus including a plurality of memory cells, each memory cell including a switching element and a storage capacitor, comprising:
   a first word line extended from a part of the plurality of memory cells;
   a second word line which is enabled after the first word line is enabled in a refresh mode for refreshing data stored in the storage capacitor; and
   a word line control circuit configured to enable and disable the first word line,
   wherein the word line control circuit comprises at least one switch that couples and decouples the first and second word lines and a capacitor,
   wherein the at least one switch couples the first word line and the capacitor for a predetermined time period before the first word line is disabled and couples the second word line and the capacitor when the second word line is enabled.

2. The semiconductor memory apparatus according to claim 1, wherein the at least one switch couples the first word line and the second word line for a predetermined time period before the first word line is disabled.

3. The semiconductor memory apparatus according to claim 1, wherein the at least one switch couples the first word line and the second word line for a predetermined time period before the second word line is enabled.

4. The semiconductor memory apparatus according to claim 1,
   wherein the at least one switch comprises a first switch and a second switch,
   wherein the set of word lines comprises the second word line and a zeroth word line,
   wherein the first switch couples the first word line and the zeroth word line for a first predetermined time period before the first word line is enabled, and
   wherein the second switch couples the first word line and the second word line for a second predetermined time period before the first word line is disabled.

5. The semiconductor memory apparatus according to claim 4, wherein the capacitor comprises:
   a first capacitor coupled to a first node at which the first switch is coupled with the zeroth word line; and
   a second capacitor coupled to a second node at which the second switch is coupled with the second word line.

6. A DRAM device, comprising:
   a first driver configured to enable or disable a first word line in response to a first word line enable signal;
   a first switch configured to couple and decouple the first word line and a capacitor in response to a first voltage transfer signal;
   a second switch configured to couple and decouple a second word line and the capacitor in response to a second voltage transfer signal; and a first control signal generation circuit configured to generate the first voltage transfer signal in response to a refresh signal and the first word line enable signal,
wherein the second word line is enabled after the first word line is enabled when the refresh signal is enabled,
wherein the first switch couples the first word line and the capacitor for a predetermined time period before the first word line is disabled and the second switch couples the second word line and the capacitor when the second word line is enabled.

7. The DRAM device according to claim 6, further comprising:
a second driver configured to enable or disable the second word line in response to a second word line enable signal; and
a second control signal generation circuit configured to generate the second voltage transfer signal in response to the refresh signal and the second word line enable signal.

8. The DRAM device according to claim 7, wherein the first control signal generation circuit disables the first voltage transfer signal regardless of the first word line enable signal when the refresh signal is disabled, and wherein the first control signal generation circuit enables the first voltage transfer signal in response to the first word line enable signal when the refresh signal is enabled.

9. The DRAM device according to claim 7, wherein, when the refresh signal is enabled, the first control signal generation circuit enables the first voltage transfer signal before the first word line enable signal is disabled and disables the first voltage transfer signal when the first word line enable signal is disabled.

10. A semiconductor memory apparatus including a plurality of memory cells, each memory cell including a switching element and a storage capacitor, comprising:
a control signal generation circuit configured to generate a plurality of voltage transfer signals in response to a refresh signal for refreshing data stored in the storage capacitor and a word line enable signal; and
a word line control circuit configured to:
enable or disable first and second word lines of a set of word lines;
couple the first word line to a first capacitor of a set of capacitors in response to the plurality of voltage transfer signals; and
decouple the first word line from the first capacitor in response to the plurality of voltage transfer signals,
wherein the word line control circuit couples the first word line and a second capacitor of the set of capacitors for a predetermined time period before the first word line is disabled and couples the second word line and the second capacitor when the second word line is enabled.

11. The semiconductor memory apparatus according to claim 10,
wherein the plurality of voltage transfer signals comprise a first voltage transfer signal and a second voltage transfer signal, and
wherein, when the refresh signal is disabled, the control signal generation circuit disables the first voltage transfer signal regardless of the word line enable signal and outputs the word line enable signal as the second voltage transfer signal.

12. The semiconductor memory apparatus according to claim 11, wherein, when the refresh signal is enabled, the control signal generation circuit generates the first voltage transfer signal, which is enabled when the word line enable signal is enabled, enables the second voltage transfer signal when the first voltage transfer signal is disabled, and again enables the first voltage transfer signal before the word line enable signal is disabled.

13. The semiconductor memory apparatus according to claim 12, wherein, when the refresh signal is enabled, the control signal generation circuit disables both the second voltage transfer signal and the again enabled first voltage transfer signal when the word line enable signal is disabled.

14. The semiconductor memory apparatus according to claim 13, wherein the word line control circuit comprises:
a first switch configured to couple and decouple the first word line and the first capacitor in response to the first voltage transfer signal; and
a driver configured to enable or disable the first word line in response to the second voltage transfer signal.

15. The semiconductor memory apparatus according to claim 11,
wherein the plurality of voltage transfer signals comprise a first voltage transfer signal, a second voltage transfer signal, and a third voltage transfer signal, and
wherein, when the refresh signal is disabled, the control signal generation circuit disables the first and third voltage transfer signals regardless of the word line enable signal and outputs the word line enable signal as the second voltage transfer signal.

16. The semiconductor memory apparatus according to claim 15, wherein, when the refresh signal is enabled, the control signal generation circuit:
enables the first voltage transfer signal when the word line enable signal is enabled,
enables the second voltage transfer signal when the first voltage transfer signal is disabled,
enables the third voltage transfer signal before the word line enable signal is disabled, and
disables the second and third voltage transfer signals when the word line enable signal is disabled.

17. The semiconductor memory apparatus according to claim 16, wherein the word line control circuit comprises:
a first switch configured to couple and decouple the first word line and the first capacitor in response to the first voltage transfer signal;
a driver configured to enable or disable the first word line in response to the second voltage transfer signal; and
a third switch configured to couple and decouple the first word line and the second capacitor in response to the third voltage transfer signal, wherein the second capacitor is coupled to the second word line of the set of word lines.

* * * * *